(12) United States Patent
Chen et al.

(10) Patent No.: US 11,715,723 B2
(45) Date of Patent: Aug. 1, 2023

(54) WAFER ON WAFER BONDING STRUCTURE

(71) Applicant: Taiwan Semiconductor Manufacturing Co., Ltd., Hsinchu (TW)

(72) Inventors: Ming-Fa Chen, Taichung (TW); Chao-Wen Shih, Zhubei (TW); Sung-Feng Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/186,984

(22) Filed: Feb. 26, 2021

(65) Prior Publication Data
US 2022/0278074 A1    Sep. 1, 2022

(51) Int. Cl.
*H01L 23/48* (2006.01)
*H01L 23/00* (2006.01)
(Continued)

(52) U.S. Cl.
CPC ............ *H01L 24/94* (2013.01); *H01L 23/481* (2013.01); *H01L 24/03* (2013.01); *H01L 24/05* (2013.01); *H01L 24/08* (2013.01); *H01L 24/27* (2013.01); *H01L 24/29* (2013.01); *H01L 24/32* (2013.01); *H01L 24/83* (2013.01); *H01L 24/92* (2013.01); *H01L 24/96* (2013.01); *H01L 25/0657* (2013.01); *H01L 25/18* (2013.01); *H01L 25/50* (2013.01); *H01L 21/304* (2013.01); *H01L 21/30625* (2013.01); *H01L 21/76898* (2013.01); *H01L 24/06* (2013.01); *H01L 24/33* (2013.01); *H01L 2224/03845* (2013.01); *H01L 2224/0557* (2013.01); *H01L 2224/06181* (2013.01); *H01L 2224/08146* (2013.01); *H01L 2224/2784* (2013.01); *H01L 2224/27831* (2013.01); *H01L 2224/27845* (2013.01); *H01L 2224/29005* (2013.01); *H01L 2224/29011* (2013.01); *H01L 2224/29016* (2013.01); *H01L 2224/32145* (2013.01); *H01L 2224/33181* (2013.01); *H01L 2224/80203* (2013.01); *H01L 2224/80895* (2013.01); *H01L 2224/83203* (2013.01);
(Continued)

(58) Field of Classification Search
CPC .......... H01L 25/0657; H01L 21/30625; H01L 2224/2784; H01L 2224/0557
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |

(Continued)

FOREIGN PATENT DOCUMENTS

| | | | |
|---|---|---|---|
| JP | 2012114214 A | 6/2012 | |
| JP | 2013055313 A | 3/2013 | |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A package structure and method of manufacturing is provided, whereby a bonding dielectric material layer is provided at a back side of a wafer, a bonding dielectric material layer is provided at a front side of an adjoining wafer, and wherein the bonding dielectric material layers are fusion bonded to each other.

20 Claims, 29 Drawing Sheets

(51) Int. Cl.
    *H01L 25/065*     (2023.01)
    *H01L 25/18*     (2023.01)
    *H01L 25/00*     (2006.01)
    *H01L 21/768*     (2006.01)
    *H01L 21/304*     (2006.01)
    *H01L 21/306*     (2006.01)

(52) U.S. Cl.
    CPC ............... *H01L 2224/83896* (2013.01); *H01L 2224/9211* (2013.01); *H01L 2225/06544* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,410,984 B1 * | 8/2022 | Current ................... H01L 21/78 |
| 2011/0171781 A1 | 7/2011 | Lee et al. |
| 2013/0037943 A1 | 2/2013 | Yamano |
| 2016/0197055 A1 | 7/2016 | Yu et al. |
| 2018/0158749 A1 * | 6/2018 | Yu ....................... H01L 23/3675 |
| 2021/0057332 A1 | 2/2021 | Chen et al. |

FOREIGN PATENT DOCUMENTS

| | | |
|---|---|---|
| KR | 101791748 B1 | 10/2017 |
| WO | 03071604 A1 | 8/2003 |

\* cited by examiner

WAFER ON WAFER BONDING STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
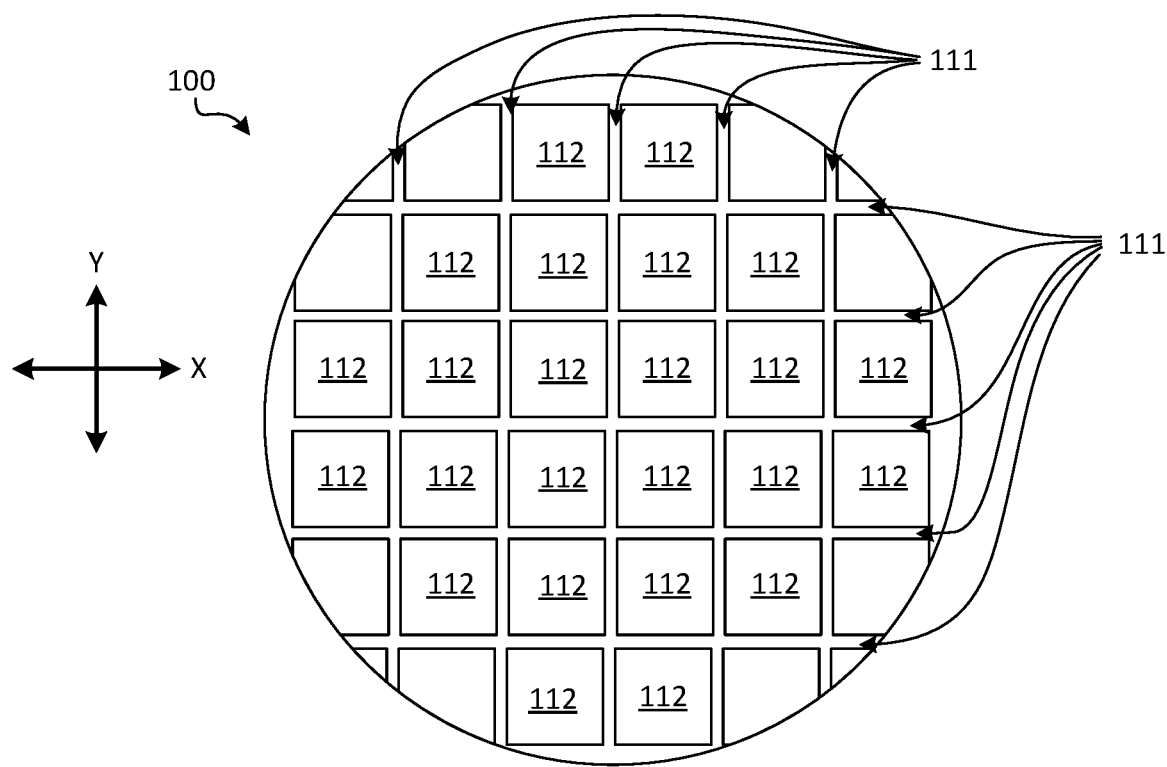
FIGS. 1 through 2, 3a through 3d, and 4 through 10 illustrate intermediate steps in a process of forming a first wafer of a package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide a multi-die stacking structure. In some embodiments, combinations of one, two, and four layer wafer structures can be attached to a device wafer, such as a controller wafer. Each of the multi-layer structures may contain active devices and through-vias through the substrate of the wafer. Prior to bonding one wafer to another wafer, the substrate can be thinned to expose the through vias. A bonding layer can then be formed so that the through-vias come through the bonding layer. The through vias can be bonded to bond pads of the next wafer. The multi-die structures can be pre-manufactured and then subsequently bonded to another wafer, such as a controller wafer.

FIGS. 1 through 7 illustrate intermediate steps in a process of forming and preparing dies 112. One or more of dies 112 can be formed to be a logic die, such as a Central Processing Unit (CPU) die, a Micro Control Unit (MCU) die, an input-output (IO) die, a BaseBand (BB) die, an Application processor (AP) die, a System on Chip (SoC), a System on Integrated Chips (SoIC), or the like. One or more of dies 112 may also be a memory die such as a Dynamic Random Access Memory (DRAM) die or a Static Random Access Memory (SRAM) die, or the like. In the illustrated embodiments, one or more dies or die stacks may be bonded to dies 112.

Referring to FIG. 1, a top down view of wafer 100 is illustrated having several dies 112, in accordance with some embodiments. The dies 112 may be configured to each include the same die function or different die functions. Between each of the dies 112 are dicing lanes 111 which are designated for singulating the dies 112 in a subsequent process. The dies 112 may be understood to be package areas and the dicing lanes 111 may be understood to be non-package areas. In some embodiments, no active or passive devices are formed in the dicing lanes 111 and, therefore, in such embodiments the dicing lanes 111 are free from active or passive devices.

Figure 2:
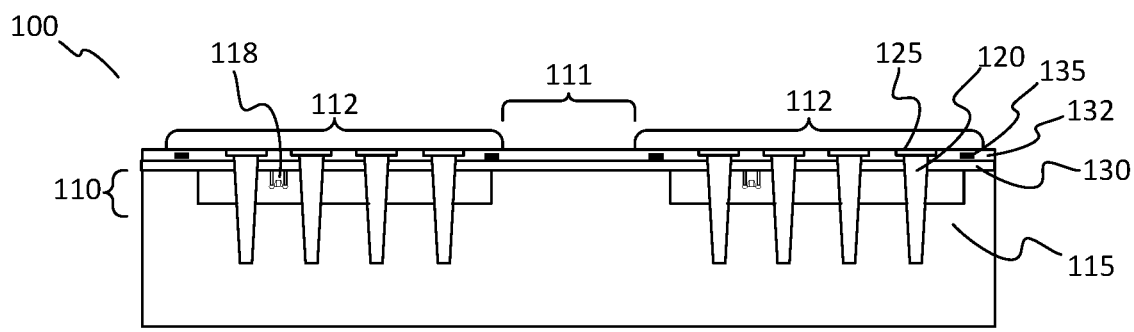

In FIG. 2, a cross sectional view of a portion of wafer 100 is illustrated. In the illustrated portion, a first die 112 and a second die 112 are illustrated and are separated by a dicing lane 111. Detail has been omitted for simplicity. It should be understood that the illustrations with respect to dies 112 are for informational purposes and should not be seen as being limited to a particular configuration.

Dies 112 may include a substrate 115 having one or more active or passive devices formed therein. Substrate 115 can be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In the illustrated embodiments, the wafer 100 includes device regions 110 for each of the dies 112. The device regions 110 may include embedded devices such as transistor 118 or other active devices, such as diodes, and possibly passive devices such as capacitors, inductors, resistors, or the like. Over the device region 110 is an interconnect structure 130 which interconnects devices and routes input/output signals to the devices.

The interconnect structure 130 may includes dielectric layers, and metal lines and vias formed in dielectric layers, which details are not shown for simplicity. The dielectric layers of the interconnect structure 130 may also be referred to as Inter-Metal Dielectric (IMD) layers. Some or all of the dielectric layers may be formed of a low-k dielectric material having a dielectric constant (k-value) lower than about 3.0 or about 2.5. The dielectric layers of interconnect structure 130 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with other embodiments of the present disclosure, some or all of dielectric layers are formed of non-low-k dielectric materials such as silicon oxide, silicon carbide (SiC), silicon carbonitride (SiCN), silicon oxy-carbo-nitride (SiOCN), or the like. In accordance with some embodiments of the present disclosure, the formation of the dielectric layers of the interconnect structure 130 includes depositing a porogen-containing dielectric material, and then performing a curing process to drive out the porogen, and hence the remaining dielectric layers becomes porous. Etch stop layers, which may be formed of silicon carbide, silicon nitride, or the like, may be formed between IMD layers.

The metal lines and vias of the interconnect structure 130 are formed in the dielectric layers of the interconnect structure 130. Accordingly, interconnect structure 130 may include a plurality of metal layers (metal lines that are in a same layer) that are interconnected through the vias of the interconnect structure 130. The metal lines and vias may be formed of copper or copper alloys, and they can also be formed of other metals. The formation process may include single damascene and dual damascene processes. In a single damascene process, a trench is first formed in one of dielectric layers of the interconnect structure 130, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

In accordance with some embodiments of the present disclosure, dielectric layers 132 are formed over the interconnect structure 130. Dielectric layers 132 may be formed of multiple layers. In some embodiments, dielectric layers 132 may be formed of silicon oxide, silicon oxynitride, silicon oxy-carbide, or the like.

Via openings corresponding to vias 120 may be formed through the dielectric layers 132 and into the substrate 115. In some embodiments, the via openings can expose metal features of the interconnect structure 130 for coupling to the active and/or passive devices in the device region 110. One or more of the via openings corresponding to the vias 120 may not expose metal features of the interconnect structure 130 such that a via material subsequently formed in the via opening is not coupled to any of the devices in the device region 110 and may be considered a dummy via. The via openings may be formed using a photo lithographic process using, for example, photo resists and/or hard masks which are formed and patterned over dielectric layer 132. An anisotropic etch may be used to form the via openings through the photo resists and/or hard masks.

Vias 120 and contact pads 125 may be formed over the dielectric layers 132. Vias 120 and contact pads 125 may be formed by processes similar to the formation of the vias and the metal lines of the interconnect structure 130, described above, though other suitable process may be used. For example, a seed layer may be deposited in the via openings, and the vias may be formed by depositing a conductive material in the via openings on the seed layer by, for example, electroplating or electroless plating. The contact pads 125 may be formed at the same time or in a subsequent similar process. Vias 120 and contact pads 125 may be formed of copper or copper alloys, and they can also be formed of other metals.

In some embodiments, the dies 112 comprise one or more known good die (KGD) which have been functionally tested. In some embodiments, dies 112 that fail testing may not undergo further processing and may be recycled or discarded. In other embodiments, the dies 112 which have failed testing may remain together in the wafer 100 with the KGDs through further processing and recycled or discarded in a later step. For example, in embodiments which use wafer to wafer bonding processes bond a whole unsingulated wafer to the wafer 100, whereas embodiments which use chip to wafer or chip to chip bonding processes bond singulated chips to the wafer 100 or singulated chips to singulated chips of the wafer 100. Thus, in some embodiments, only dies 112 which are KGDs undergo subsequent processing for packaging, and dies which fail the CP testing are not packaged.

Figure 3A:
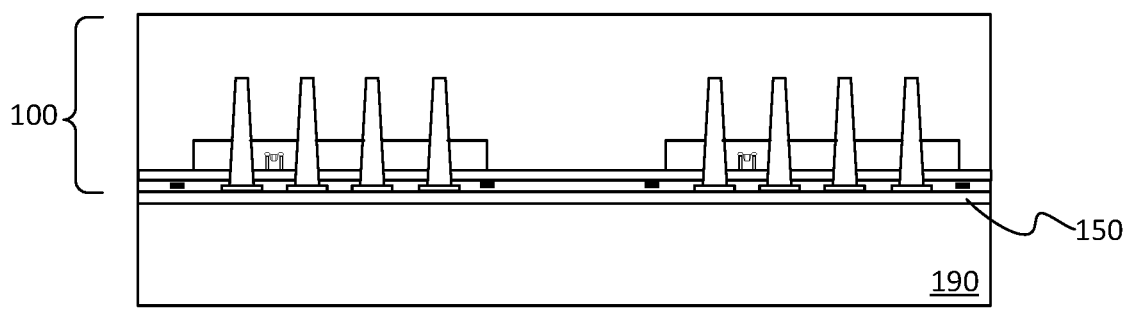
Figure 3B:
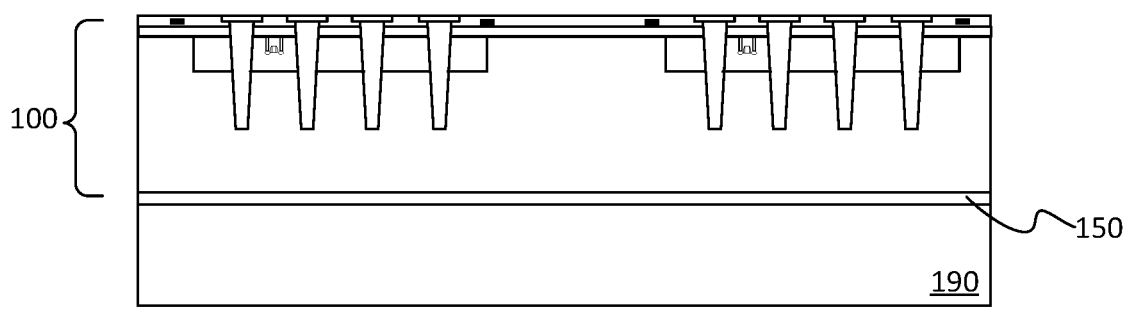
Figure 3C:
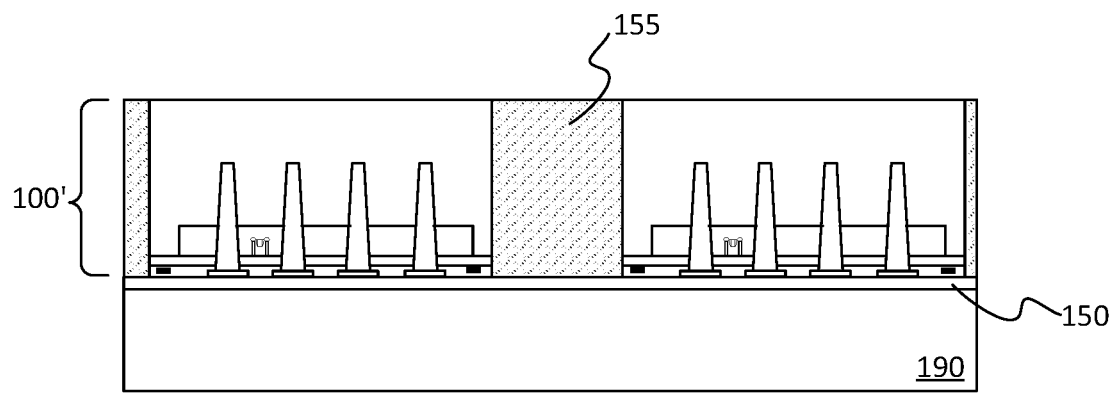
Figure 3D:
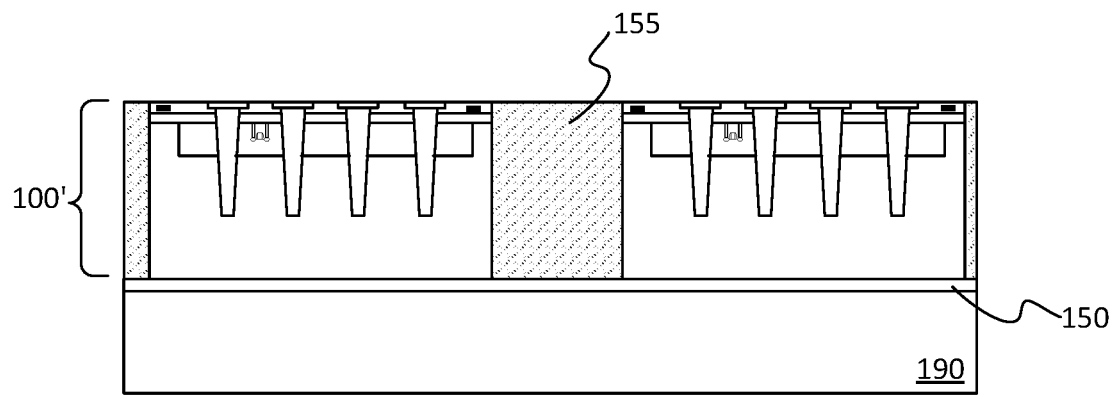

FIGS. 3a, 3b, 3c, and 3d illustrate various embodiments for using the wafer 100 and dies 112 in a packaging process. In FIGS. 3a and 3b the wafer 100 is left intact and attached to a carrier substrate 190, and in FIGS. 3c and 3d the wafer 100 is singulated to release the dies 112. The KGDs may then be attached to the carrier substrate 190. In FIGS. 3a and 3c, the wafer 100 and/or dies 112 are rotated (i.e., flipped over and attached face down to the carrier substrate 190. In FIGS. 3b and 3d, the wafer 100 and/or dies 112 remain face up and the back side (inactive side) of the wafer 100 and/or dies 112 are attached to the carrier substrate 190.

Generally, carrier substrate 190 provides temporary mechanical and structural support to various features (e.g., wafer 100) during subsequent processing steps. In this manner, damage to the dies 112 is reduced or prevented. Carrier substrate 190 may comprise, for example, glass, ceramic, bulk silicon, and the like. A release layer 150 may be used to attach wafer 100 and/or dies 112 to carrier substrate 190. In some embodiments, carrier substrate 190 may be substantially free of any active devices and/or functional circuitry. In some embodiments, carrier substrate 190 may comprise bulk silicon, and wafer 100 and/or dies 112 may be attached to carrier substrate 190 by a dielectric release layer 150. In some embodiments, the carrier substrate 190 may comprise a support tape.

Release layer 150 may be any die attach film or any suitable adhesive, epoxy, ultraviolet (UV) glue (which loses its adhesive property when exposed to UV radiation), or the like. Release layer 150 may be formed using a deposition process, a spin coating, a printing process, a lamination process, or the like over the surface of the carrier substrate 190 or over the surface of the wafer 100 and/or dies 112. In other embodiments, the release layer 150 may be a thermal type, wherein adhesive strength of the release layer is substantially reduced after exposing the release layer 150 to a suitable heat source.

In some embodiments, attaching the wafer 100 and/or dies 112 to the carrier substrate 190 uses a fusion bonding process where an insulating layer of the wafer 100 is directly bonded to a dielectric release layer 150 to form an insulator-to-insulator bond. Further details on fusion bonding are discussed below in conjunction with the wafer-to-wafer bonding described below, with respect to FIG. 20a.

In some embodiments, e.g., FIGS. 3c and 3d, the wafer 100 is singulated into individual dies 112, for example, by sawing, laser ablation, or the like. Subsequently, the dies may positioned on the carrier substrate 190 by a pick and place process. A gap-fill material 155 may then be deposited to encapsulate the dies 112 and then ground back so that an upper surface of the gap-fill material 155 is level with an upper surface of the dies 112. The gap-fill material 155 may comprise a molding compound such as an epoxy, a resin, a moldable polymer, polyimide, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid. In some embodiments, the gap-fill material 155 may comprise a non-polymer like silicon dioxide, silicon nitride, or the like, such as another oxide or nitride, which is deposited using any suitable process. For example, the gap-fill material 155 may be formed by CVD, PECVD or ALD deposition process, FCVD, or a spin-on-glass process. The resulting structure may be referred to for ease of reference as wafer 100', however, it should be realized that this is not actually a wafer, but may be used in a substitutionary fashion for wafer 100 in the continuing description.

Figure 4:
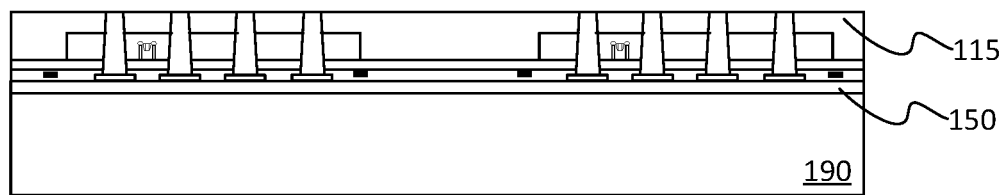

In FIGS. 4 through 7, the wafer 100 or wafer 100' are face down, for example, as in FIGS. 3a and 3c, in accordance with some embodiments. In such embodiments, the back side of the wafer 100 or wafer 100' may be thinned. Although the structure from FIG. 3a is illustrated, it should be understood that the structure (referred to as wafer 100') in FIG. 3c may be substituted instead. The structures in FIGS. 3b and 3d may also be substituted, however, since these are orientated face up, the processes illustrated in FIGS. 4 through 7 are omitted in such embodiments. In FIG. 4, the wafer 100 is thinned to reduce the thickness of the wafer 100. Thinning can be done by a CMP process, grinding, etching, or other suitable process. Thinning exposes vias 120 in the wafer 100 and/or dies 112 and also reduces the thickness of wafer 100 and/or dies 112 to provide better heat dissipation and take less vertical space. After thinning, the wafer 100 and/or dies 112 may be about 2 to 100 μm thick, such as between about 10 and 50 μm thick. In some embodiments, a top surface of the gap-fill material 155 and upper surface (the back side) of wafer 100 and/or dies 112 are substantially co-planar within process variations.

In other embodiments, the vias 120 may be formed after thinning the wafer 100 and/or dies 112, rather than before thinning. In such embodiments, the vias 120 may be formed using processes and materials similar to those already described above for the formation of the vias, for example, of the interconnect structure 130.

Figure 5:
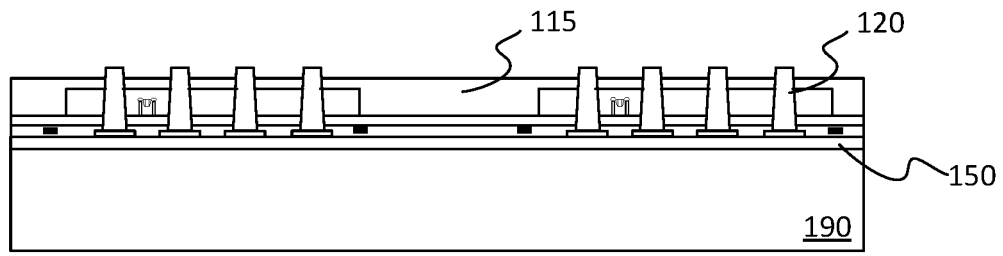
Figure 6:
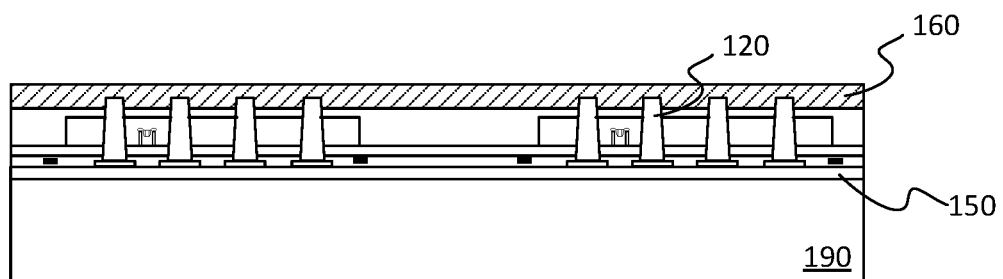
Figure 7:
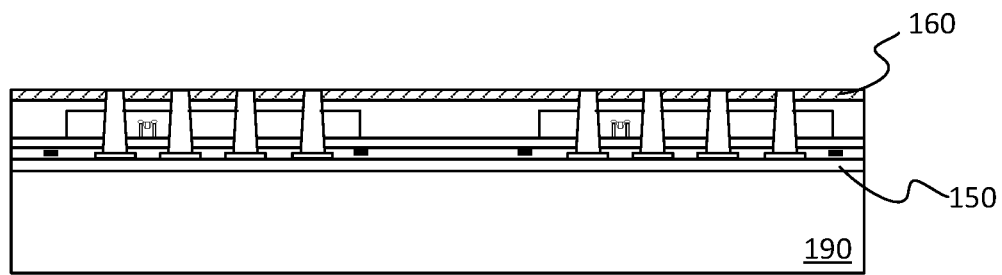

FIGS. 5 through 7 include a process of adding a bonding layer to the back of the thinned substrate 115 of FIG. 4, in accordance with some embodiments. In FIG. 5, the substrate 115 may be recessed by any suitable process, for example, by an etch back process using a suitable wet or dry etching process. Upper sidewalls of the vias 120 may thus be exposed. In some embodiments, the substrate 115 may be recessed by a depth of between 0.8 μm and about 3 μm, though other dimensions are contemplated and may be used.

In FIG. 6, a bonding layer 160 may be deposited over the exposed portions of the vias 120. The bonding layer 160 may be any suitable insulating material, such as an oxide, such as silicon oxide or a nitride, such as silicon nitride, or a polyimide, or the like. The bonding layer 160 may be deposited using any suitable process. For example, the bonding layer 160 may be formed by CVD, PECVD or ALD deposition process, FCVD, or a spin-on-glass process.

In FIG. 7, the bonding layer 160 may be planarized, such as by a CMP process, thereby levelling an upper surface of the vias 120 with the bonding layer 160. The thickness of the bonding layer 160 may be between about 0.8 μm and 3 μm, though other dimensions are contemplated and may be used.

Figure 8:
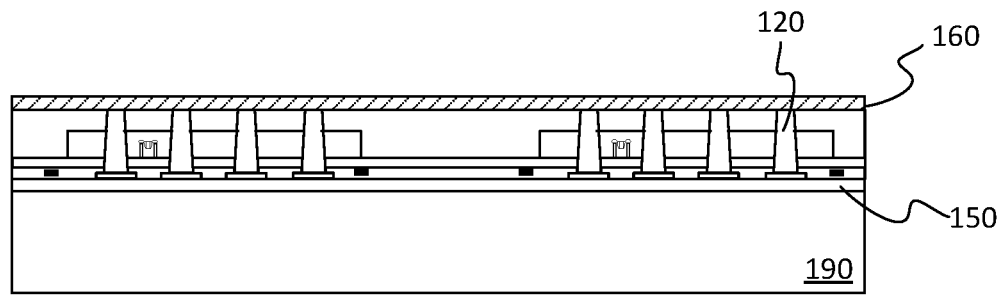
Figure 9:
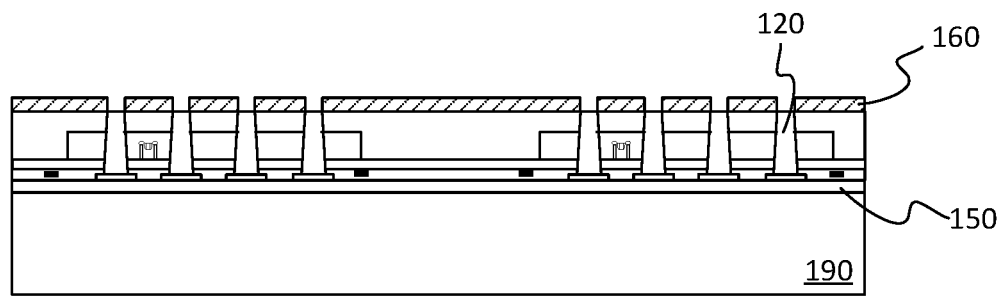
Figure 10:
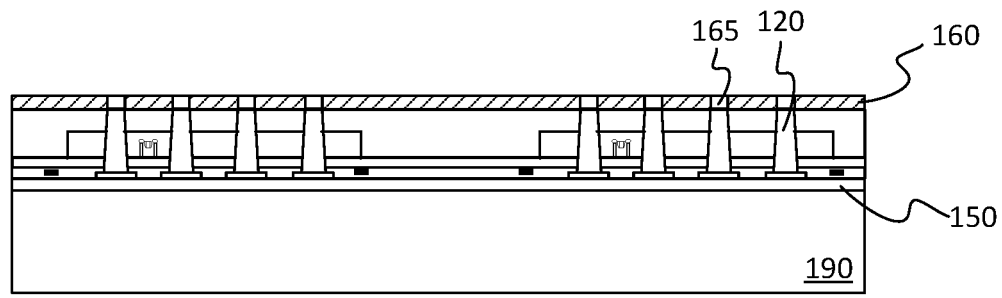

FIGS. 8 through 10 include a process of adding a bonding layer to the back of the thinned substrate 115 of FIG. 4, in accordance with some embodiments. In FIG. 8, a bonding layer 160 is deposited over the substrate 115 and vias 120. The bonding layer 160 may be formed using processes and materials similar to those discussed above with respect to FIG. 6. The thickness of the bonding layer 160 may be between about 0.8 μm and 3 μm, though other dimensions are contemplated and may be used.

In FIG. 9, openings are formed in the bonding layer 160 corresponding to the vias 120. The openings may be formed using any suitable technique, such as by mechanical or laser drilling or photolithography technique. In some embodiments, the openings may have a larger width than the vias 120.

In FIG. 10, via extensions 165 are deposited in the openings of the bonding layer 160. The via extensions 165 may be the same material or a different material than the material of the vias 120. The via extensions 165 may be formed by any suitable technique, such as by using PVD, CVD, electroplating, electroless plating, etc. In some embodiments a seed layer and/or a barrier layer may be deposited in the opening and over the bonding layer 160 before depositing the via extensions 165. The material of the via extensions 165 may protrude above the openings and over the bonding layer 160. Following the deposition of the material of the via extensions 165, a planarization technique, such as a CMP, may be used to level the via extensions 165 with the bonding layer 160. In some embodiments the via extensions 165 may be wider than the vias 120, forming a pad area.

In embodiments, the wafer 100 and/or dies 112 may have a wafer or wafer stack bonded thereto in a wafer on wafer or wafer on chip bonding process. In embodiments where a wafer stack is used, the wafer stack may be separately formed and bonded in a pre-formed wafer stack onto the wafer 100 and/or dies 112. These embodiments are described below.

Figure 11:
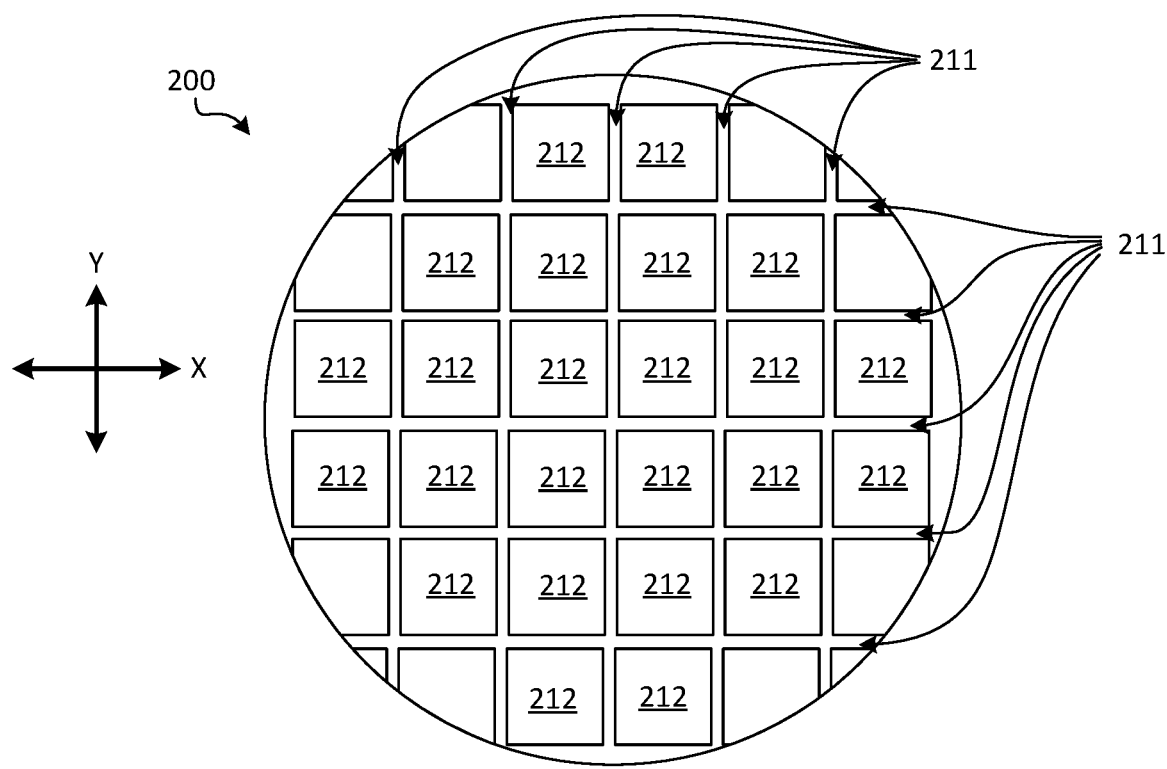
FIGS. 11 through 19 illustrate intermediate steps in a process of forming a second wafer of a package, in accordance with some embodiments.

In FIG. 11, a top down view of wafer 200 is illustrated having several dies 212, in accordance with some embodiments. The dies 212 may be configured to each include the same die function or different die functions. In some embodiments, the dies 212 can be formed to be a logic die, such as a CPU die, a MCU die, an IO die, a BB die, an AP die, a SoC, a SoIC, or the like. In other embodiments, one or more of the dies 212 may be a memory die such as a DRAM die or a SRAM die, or the like. In the illustrated embodiments, multiple ones of the wafer 200 may be stacked to form a memory device stack. Between each of the dies 212 are dicing lanes 211 which are designated for singulating the dies 212 in a subsequent process. The dies 212 may be understood to be package areas and the dicing lanes 211 may be understood to be non-package areas. Generally, no active or passive devices are formed in the dicing lanes 211 and, therefore, the dicing lanes 211 are free from active or passive devices.

Figure 12:
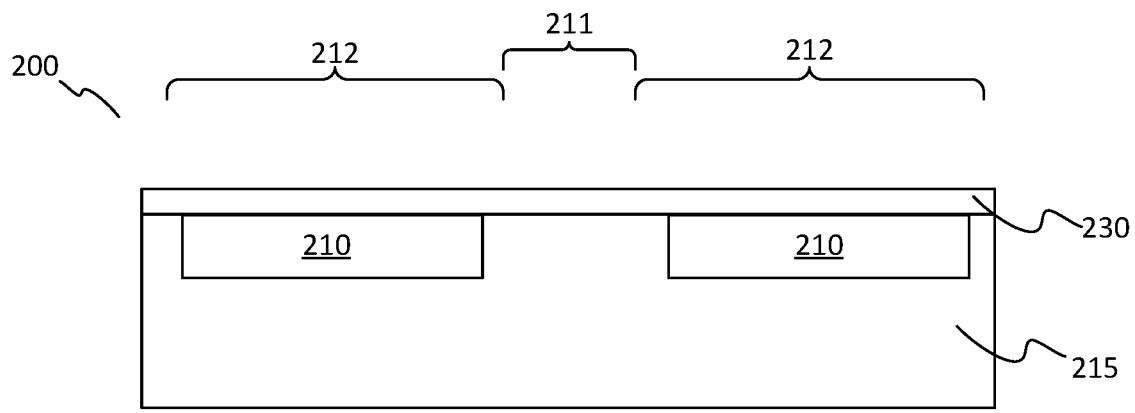

In FIG. 12, a cross sectional view of a portion of wafer 200 is illustrated. In the illustrated portion, a first die 212 and a second die 212 are illustrated and are separated by a dicing lane 211. Detail has been omitted for simplicity. It should be understood that the illustrations with respect to dies 212 are for informational purposes and should not be seen as being limited to a particular configuration.

Dies 212 may include a substrate 215 having one or more passive devices formed therein. Substrate 215 may be formed of materials similar to those discussed above with respect to substrate 115, and are not repeated.

The wafer 200 includes device regions 210 for each of the dies 212. The device regions 210 may similar to the device regions 110 in that they may include embedded devices such as transistors or other active devices, such as diodes, and possibly passive devices such as capacitors, inductors, resistors, or the like. Over the device region 210 is an interconnect structure 230 which interconnects devices and routes input/output signals to the devices. The interconnect structure 230 may be formed using similar materials and processes as the interconnect structure 130, described above. In particular, the interconnect structure 230 may include several ILD layers including an uppermost ILD layer which may, itself, include multiple layers such as described above with the dielectric layer 132.

Figure 13:
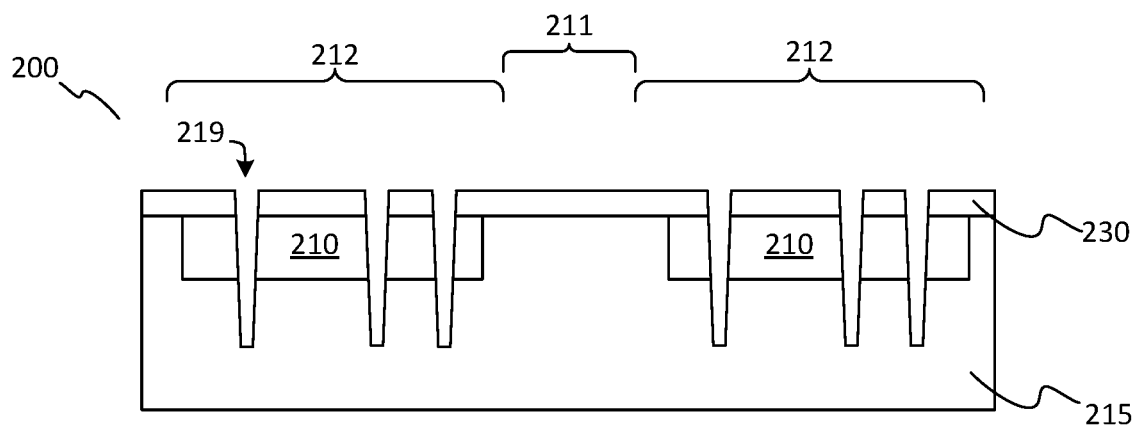

In FIG. 13, via openings 219 may be formed through the interconnect structure 230 and into the substrate 215. In some embodiments, the via openings can expose metal features of the interconnect structure 230 for coupling to the active and/or passive devices in the device region 210. One or more of the via openings 219 may not expose metal features of the interconnect structure 230 such that a via material subsequently formed in the via openings 219 is not coupled to any of the devices in the device region 210 and may be considered a dummy via. The via openings 219 may be formed using a photo lithographic process using, for example, photo resists and/or hard masks which are formed and patterned over the upper dielectric layer of the interconnect structure 230. An anisotropic etch may be used to form the via openings through the photo resists and/or hard masks. Via openings 219 may be formed in any suitable pattern into the substrate 215.

Figure 14:
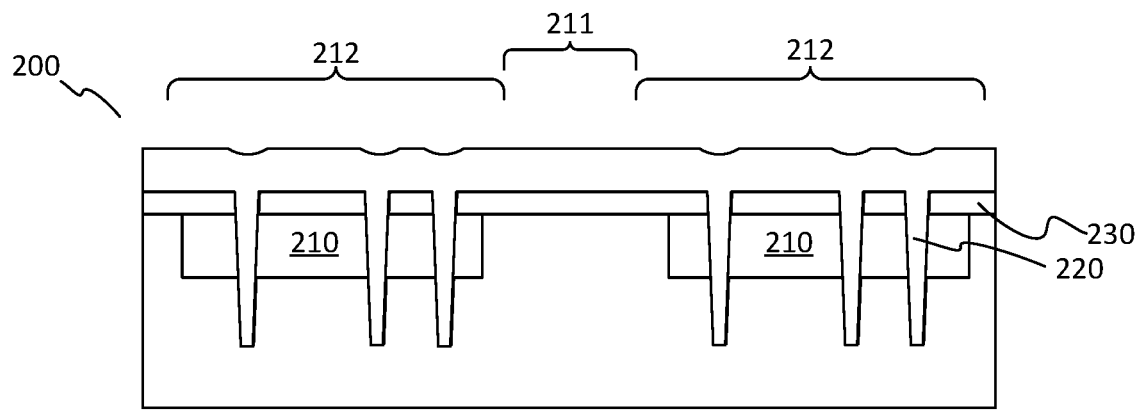

In FIG. 14, in accordance with some embodiments, material for vias 220 may be formed over the interconnect structure 230. Vias 220 may be formed by processes similar to the formation of the vias of the interconnect structure 130, described above, though other suitable process may be used. For example, a seed layer may be deposited in the via openings 219, and the vias 220 may be formed by depositing a conductive material in the via openings 219 on the seed layer by, for example, electroplating, electroless plating, PVD, CVD, or the like. In some embodiments, the contact pads 225 (see FIG. 16) may be formed at the same time. Vias 220 may be formed of copper or copper alloys, and they can also be formed of other metals. The material for the vias 220 may protrude above the via openings 219 and cover portions of the interconnect structure 230.

Figure 15:
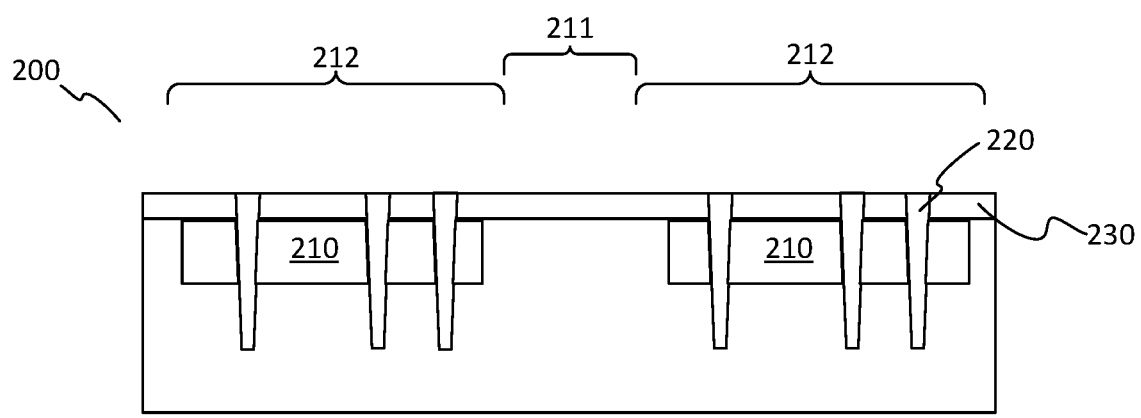
Figure 16:
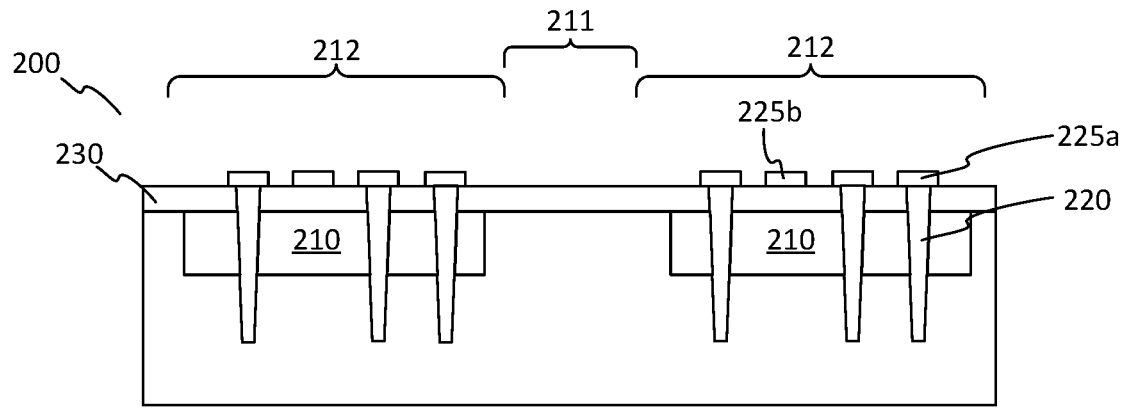

In FIG. 15, a planarization or grinding process may be used to level an upper surface of the vias 220 with an upper surface of the interconnect structure 230. In FIG. 16 contact pads 225 are formed. The contact pads 225a are physically and electrically coupled to a via 220 and the contact pads 225b are not physically coupled to a via 220, but may be physically and electrically coupled to a metal line in the interconnect structure 230. As such, it may also be electrically coupled to a via 220 through the interconnect structure 230. The contact pads 225 may be formed using any suitable process. For example, a resist layer may be deposited and patterned to form openings corresponding to the contact pads 225. A seed layer may be deposited in the openings and over the resist layer. Next, the contact pads 225 may be deposited using any suitable process and then may be leveled as needed. Finally, the resist layer may be removed, which also removes the seed layer and any metal deposited on the seed layer over the resist layer. In another embodiment, the contact pads 225 may also be deposited by forming a blanket layer of conductive material and etching to remove the portions of the conductive material which are not to be kept.

In another embodiment, a dielectric layer may be deposited over the interconnect structure 230, openings formed in the dielectric layer corresponding to the contact pads 225, a seed layer deposited in the openings, and the material of the contact pads 225 deposited in the openings on the seed layer. Then a planarization process may provide a flat upper surface.

Figure 17:
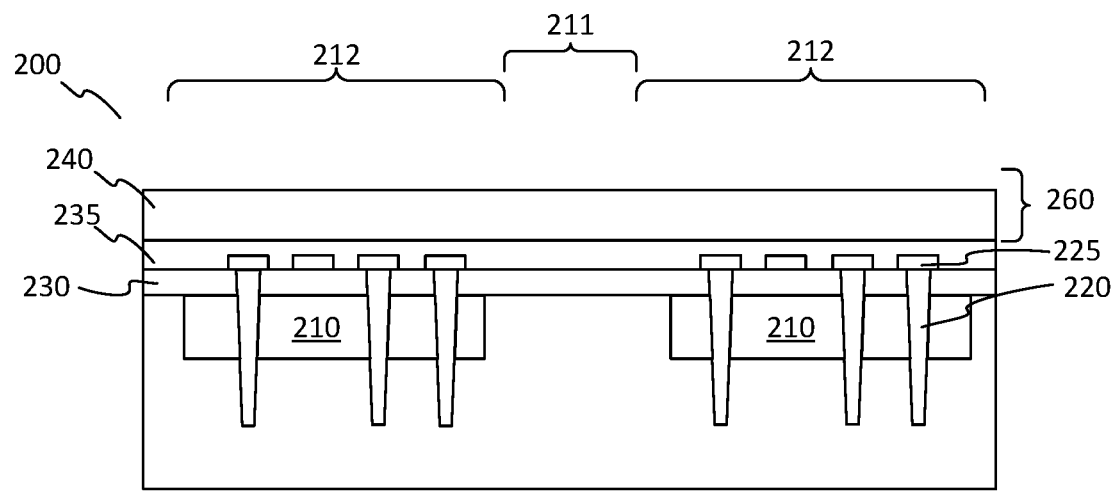

In FIG. 17, a dielectric layer 235 is deposited over the contact pads 225. In some embodiments, the dielectric layer 235 (or a sub-layer thereof) may correspond to the dielectric layer used to aid in the formation of the contact pads 225. The thickness of the dielectric layer 235 may be between 0 nm and 50 nm greater than the thickness of the contact pads 225. In other words, in some embodiments, the dielectric layer 235 may be thicker than the contact pads 225, while in other embodiments, the dielectric layer 235 may have an upper surface which is level with the upper surface of the contact pads 225.

Figure 19:
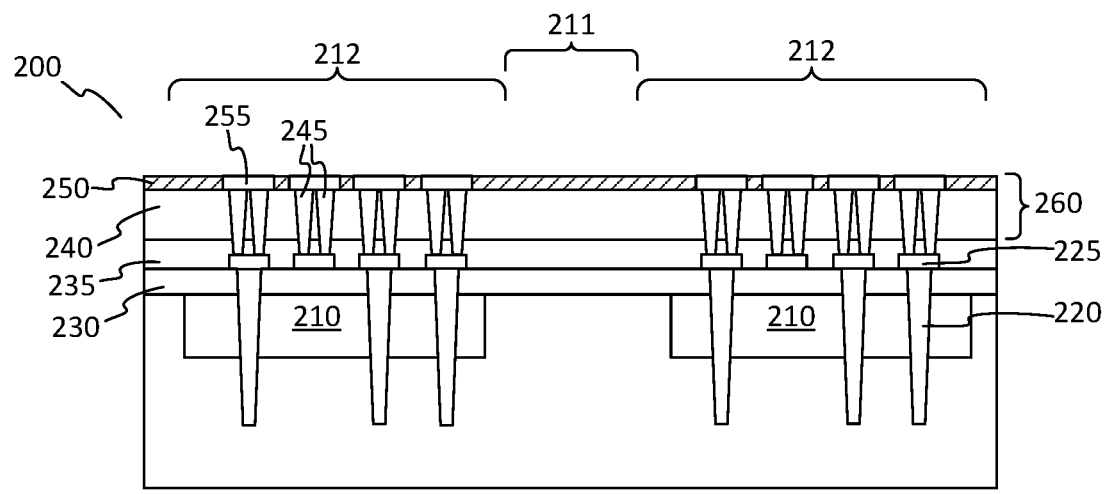

Also in FIG. 17, a dielectric layer 240 may be deposited over the contact pads 225 as part of a bonding structure 260 (see FIG. 19). The dielectric layer 235 and dielectric layer 240 may include any suitable dielectric material, such as silicon oxide, silicon nitride, silicon oxynitride, silicon oxycarbide, silicon oxy-carbo-nitride, or the like, and may be formed using any suitable process. For example, the dielectric layer 235 and dielectric layer 240 may be formed by CVD, PECVD or ALD deposition process, FCVD, or a spin-on-glass process.

Figure 18:
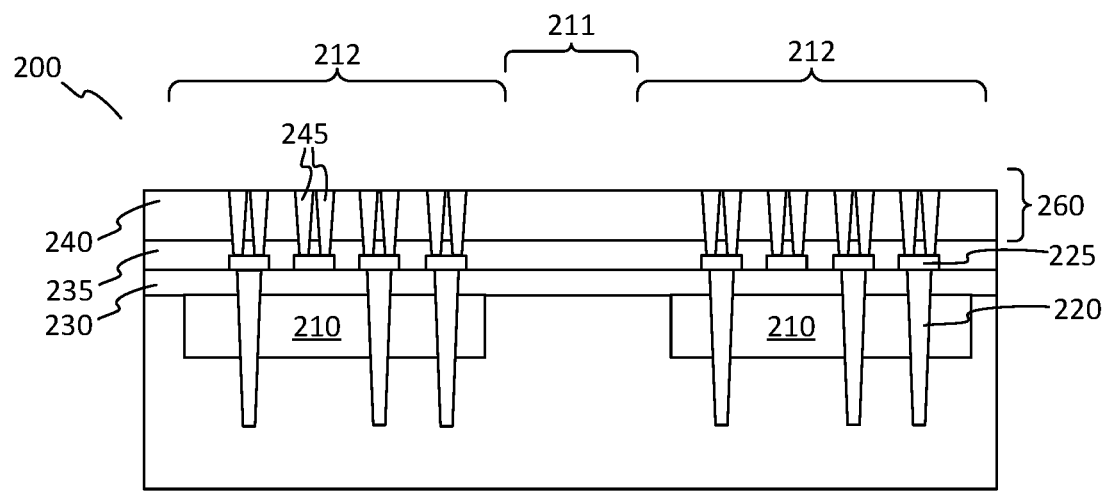

In FIG. 18, bond pad vias 245 are formed. The bond pad vias 245 may be formed using processes and materials similar to the vias 220, described above. In another embodiment, the bond pad vias 245 may be formed at the same time as the bond pads 255 (see FIG. 19).

In FIG. 19, a bonding layer 250 is deposited over the dielectric layer 240. Bond pads 255 are formed in the bonding layer 250. The bond pads may be formed using any of the materials and processes described above with respect to the contact pads 225. In some embodiments, the bonding layer 250 is formed prior to the bond pad vias 245 being formed. Then, the bond pad vias 245 and bond pads 255 may be formed at the same time by forming openings in the bonding layer 250 corresponding to the bond pads 255 and then openings in the dielectric layer 240 corresponding to the bond pad vias 245. Next, a barrier layer may be deposited in the openings for both the bond pad vias 245 and bond pads 255 at the same time, followed by the conductive material of the bond pads 255. Finally, any excess conductive material can be removed by a planarization or grinding process that levels the upper surfaces of the bond pads 255 and the bonding layer 250.

In some embodiments the bonding layer 250 may be formed of any suitable material and may be between about 0.8 μm and about 3 μm, although other dimensions may be used. In some embodiments the bonding layer 250 may be formed of an oxide, such as silicon oxide or a nitride, such as silicon nitride, or a polyimide, or the like. In some embodiments, the bonding layer 250 may be formed of the same material as that used in the formation of the bonding layer 160. The bonding layer 250 is used to form a fusion bond with another bonding layer 250 in a wafer-to-wafer bonding process. A similar process may also be used to form a fusion bond between the bonding layer 250 and the bonding layer 160 (see FIGS. 7 and 9).

Figure 20A:
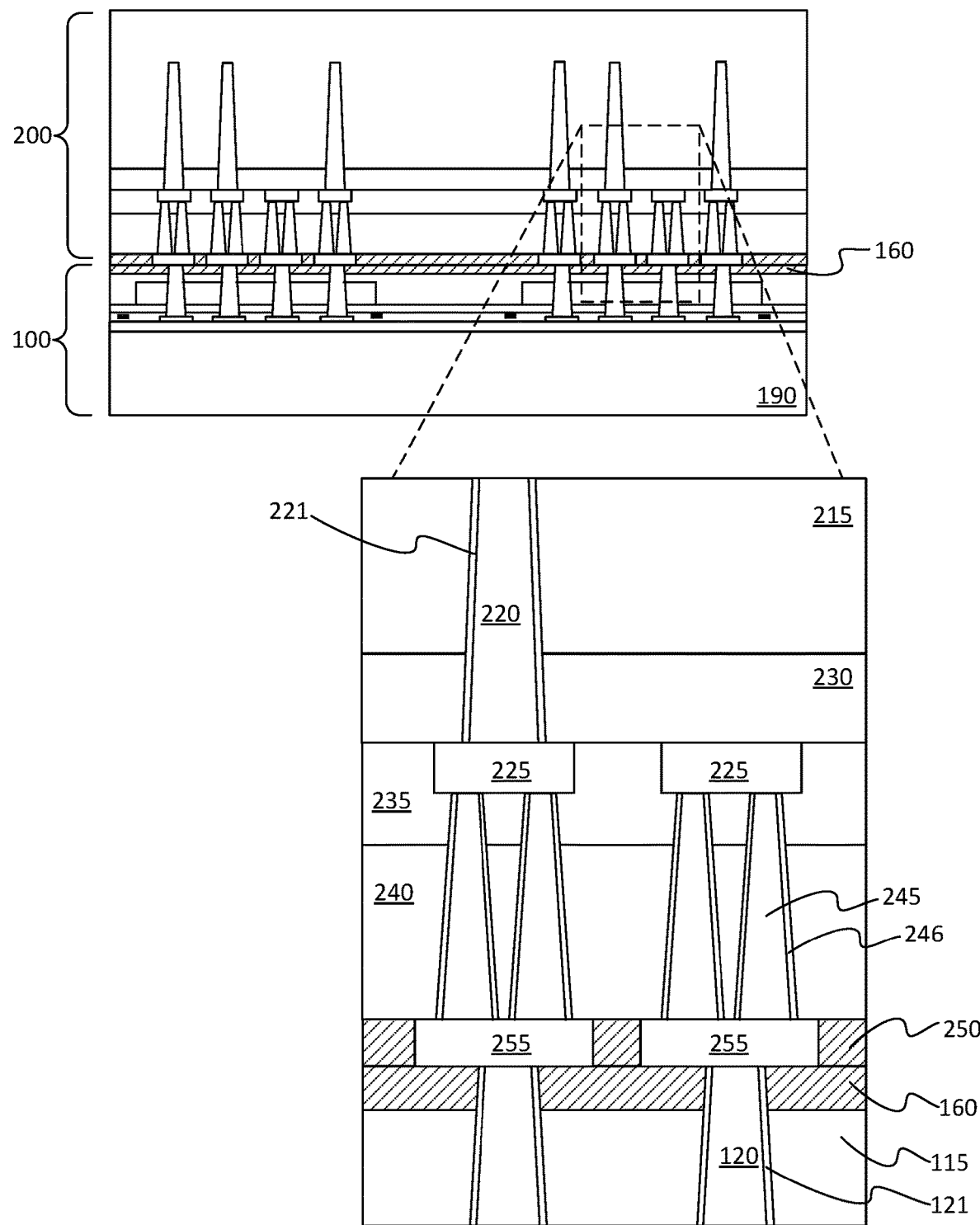
FIGS. 20a, 20b, and 21 through 26 illustrate a wafer stack configuration, in accordance with some embodiments.

In FIG. 20a, the wafer 200 is flipped over and bonded to the wafer 100, for example, of FIG. 7 or FIG. 10. The bonding technique used may be a hybrid bonding technique where the bonding layer 160 of wafer 100 and the bonding layer 250 of wafer 200 are fused together by fusion bonding and the bond pad 255 is directly bonded together to the via 120 by a direct metal to metal bond without the use of a interfacing bonding material, such as solder or other eutectic material. Hybrid bonding has a benefit of not needing solder materials between the two bonded connectors. Hybrid bonding creates a bonding interface between two devices which includes direct metal-to-metal bonding of the metal features in a first device to metal features in a second device as well as fusion bonding (or dielectric-to-dielectric bonding) of insulating materials in the first device to insulating materials in the second device. Any suitable hybrid bonding process can be used.

In the hybrid bonding process, the bond pads 255 and bonding layer 250 are aligned and contacted to the vias 120 and bonding layer 160 of the wafer 100. Subsequently, an anneal may be performed to directly bond the conductive materials and fusion bond the insulating materials together. The anneal causes the inter-diffusion of the metals in the bond pads 255 and via 120 to cause a direct metal-to-metal bond. The anneal also causes the bonding layer 250 to fusion bond to the bonding layer 160 where they are in direct contact by forming chemical bonds between the two layers. For example, the atoms (such as oxygen atoms) in one of the insulating materials of the bond layer 160 and 250 can form chemical or covalence bonds (such as O—H bonds) with the atoms (such as hydrogen atoms) in the other one of the bond layers 160 and 250. The resulting bonds between the bond layers 160 and 250 are insulator-to-insulator bonds. Slight variations in surfaces of the bonding structures can be overcome through the annealing process while pressure keeps the structures together. In some embodiments a pressing force of about 1 to 10 Newtons can be exerted to press the bond pads 255 and vias 120 together and bonding layer 250 and bonding layer 160 together. Other embodiments may not utilize a pressing force. The hybrid bonding process may be performed in an environment from about 1 atm to about 100 atm, such as about 5 atm. Expansion of materials under anneal temperatures can complete the bonding and substantially eliminate voids.

The annealing temperature in the hybrid bonding process may be between about 150° C. and about 400° C., depending on the robustness of the material of the bonding layers 160 and 250. In embodiments where both bonding layers 160 and 250 are formed of inorganic dielectric materials such as an oxide or oxynitride, the annealing temperature may be between about 150° C. and about 400° C. The annealing time for the hybrid bonding process may be between about 0.5 hour and 5 hours.

By forming bonding layers 160 and 250 specifically for bonding the wafer 200 to the wafer 100, a better fusion bond can be formed. In particular, the thicknesses of the bonding layers 160 and 250 being between about 0.8 μm and 3 μm or greater provides a sufficient bonding layer thickness to allow the chemical bonding to occur. The minimum target thickness of 0.8 μm is important for several reasons. The thickness provides some allowance for layer thickness variation in the two bonding layers 160 and 250. Due to layer thickness variation, when the two bonding layers 160 and 250 are mated together some voids between the two layers may be observed. With the minimum thickness of about 0.8 μm, the bonding layer 160 and bonding layer 250 can each expand vertically when annealed helping to fill such voids. The minimum 0.8 μm thickness also provides sufficient opportunities for bonds between the bonding layers 160 and 250 to form. In other words, during the anneal process(es), chemical or covalence bonds can form between materials in the bonding layer 160 and materials in the bonding layer 250. Having a minimum thickness of about 0.8 μm provides enough bonding material so that the localized bonds in each of the bonding layers 160 and bonding layer 250 can break and re-form crossbonded to the opposite bonding layer 160 and 250. The minimum 0.8 μm thickness also provides sufficient material to survive several anneal cycles. As noted above and in subsequent discussion below, after different structures are bonded together in an anneal process, subsequent structures (e.g., wafer 200 or wafer stacks 300 or wafer stacks 400) may also be bonded in subsequent anneal processes. As discussed above, each anneal process may be between 0.5 hours and 5 hours. As such the bonding layers 160 and bonding layers 250 must survive several anneal processes. Having a minimum thickness of about 0.8 µm of the bonding layers 160 and 250 provides suitable robustness to survive these anneal cycles. It should be noted that some embodiments contemplate other thicknesses, including thicknesses less than 0.8 µm, depending on the material of the bonding layers 160 and 250. It should also be understood that variations in total thickness can cause thicknesses of the bonding layers 160 and 250 to be less than 0.8 µm in some areas.

The bonded conductive materials of bond pads 255 and vias 120 may have distinguishable interfaces. That is, even after bonding one may be able to observe the interface and determine that the bond pads 255 and vias 120 were formed separately and joined together. Similarly, the bonded insulating materials of the bonding layer 250 and the bonding layer 160 may also have a distinguishable interface.

FIG. 20a includes an enlarged (magnified) portion of the bonding interface. In this enlarged portion a barrier layer 221 is illustrated as surrounding via 220. Similarly, a barrier layer 121 is illustrated as surrounding via 120 and a barrier layer 246 is illustrated as surrounding bond pad vias 245.

Figure 20B:
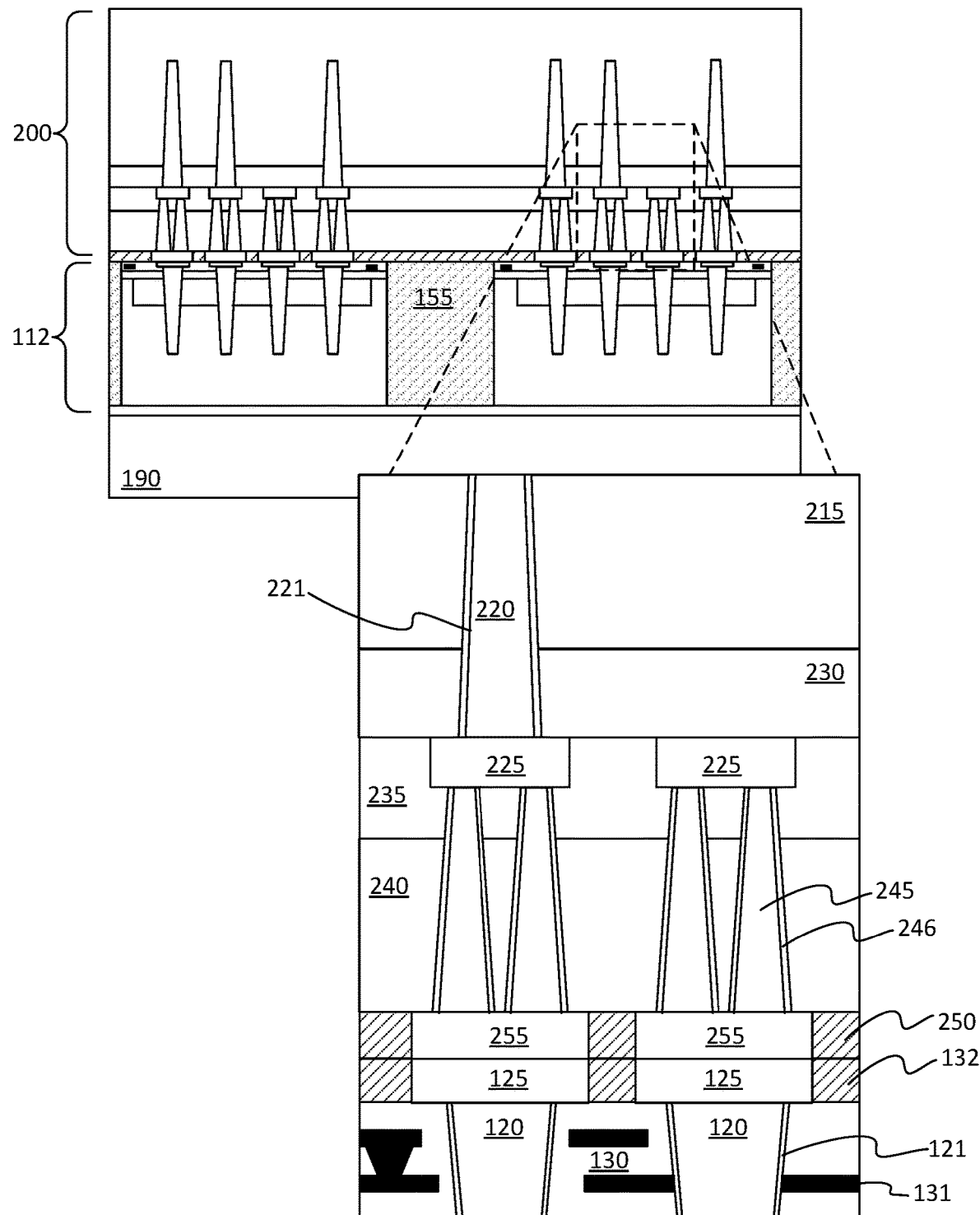

FIG. 20b illustrates a hybrid bonding process where the bottom structure is not face down, but is face up, such as provided in FIGS. 3b and 3d. In particular, FIG. 20b includes the structure illustrated in FIG. 3d as the bottom structure. The enlarged portion of FIG. 20b illustrates a bond pad to bond pad metal to metal bond and the fusion bond of the bonding layer 250 with the dielectric layer 132, following the hybrid bonding process. The enlarged portion also illustrates metal features 131 including metal lines and vias in the interconnect structure 130 some vias 120 may be electrically and physically coupled to the metal features 131 in the interconnect structure 130, while others may not be. Although the structure in FIG. 3d is illustrated, the enlarged portion would be applicable to either the structure in FIG. 3b or 3d.

Figure 21:
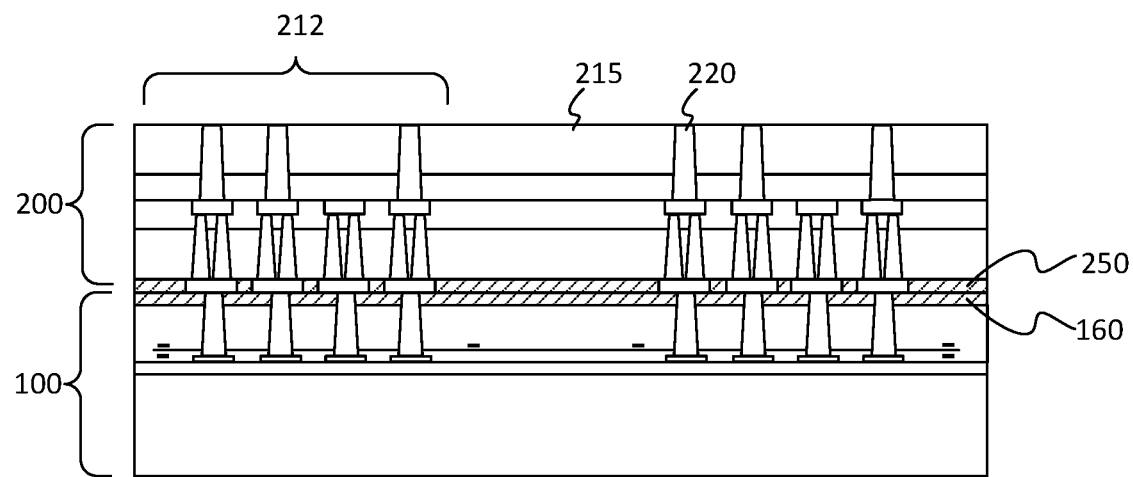

In FIG. 21, the wafer 200 is thinned using any suitable process. Thinning can be done by a CMP process, grinding, etching, or other suitable process. Thinning exposes vias 220 in dies 212 and also reduces the thickness of the dies 212 to provide better heat dissipation and take less space. After thinning, the wafer 200 and dies 212 can be about 2 µm to 500 µm thick, for example, between about 10 µm and 50 µm thick. In some embodiments, top surfaces of the substrate 215 and vias 220 are level with each other.

Figure 22:
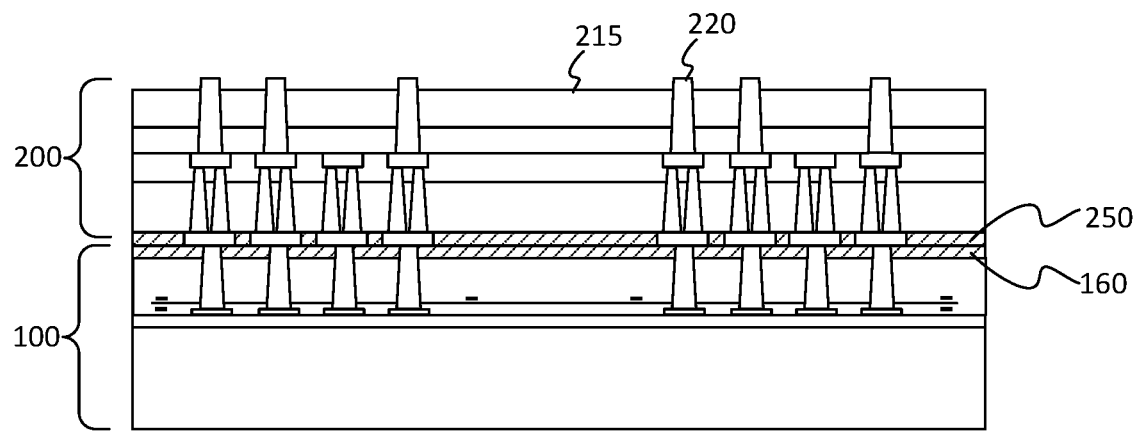
Figure 23:
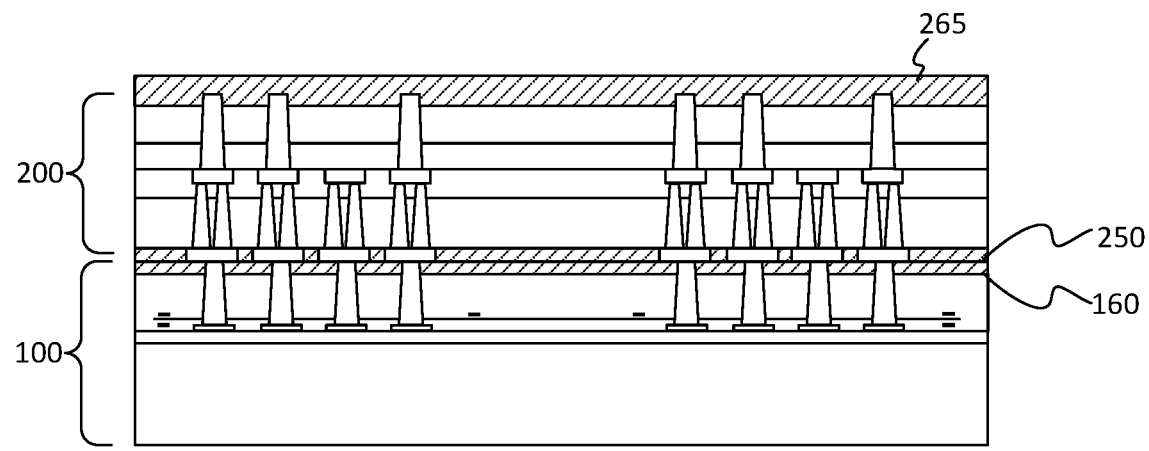
Figure 24:
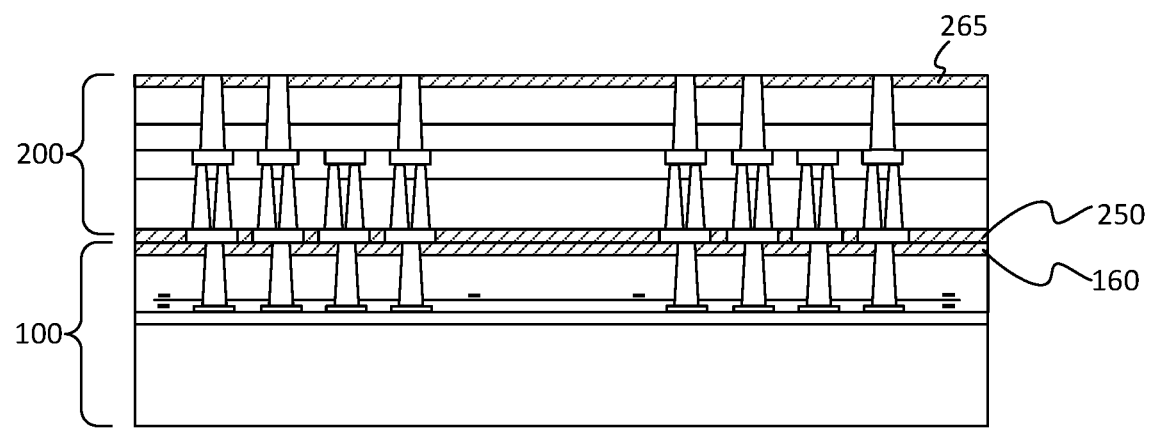

In FIGS. 22 through 24, the wafer 200 is prepared to receive another wafer bonded to it by adding a reverse bonding layer 265 (FIG. 24), in accordance with embodiments. In some embodiments, such as illustrated in FIG. 22, the substrate 215 of wafer 200 may be recessed to expose the upper sidewalls of the vias 220. This process may be similar to the process described above with respect to recessing the substrate 115 of FIG. 5. In particular, the substrate may be recessed by a depth of 0.8 µm to about 3 µm, or in other words, the vias 220 may protrude from the substrate 215 by 0.8 µm to about 3 µm. In FIG. 23, the reverse bonding layer 265 may be deposited over the exposed vias 220. The reverse bonding layer 265 may be deposited using processes and materials similar to those described above with respect to the bonding layer 160 of FIG. 6. In FIG. 24, the reverse bonding layer 265 may be planarized by a CMP or grinding process to level the upper surfaces of the reverse bonding layer 265 with the upper surfaces of the vias 220. This process may be similar to the process described above with respect to the bonding layer 160 and vias 120 of FIG. 7.

In other embodiments, the substrate 215 may not be recessed and the reverse bonding layer 265 may be deposited over the substrate 215 and exposed vias 220, similar to the bonding layer 160 described above with respect to FIG. 8. Next, openings may be made in the reverse bonding layer 265, similar to the process described above with respect to FIG. 9. Then, via extensions may be formed in the openings and the upper surfaces of the via extensions leveled with the upper surface of the reverse bonding layer 265, similar to the process described above with respect to FIG. 10.

Figure 25:
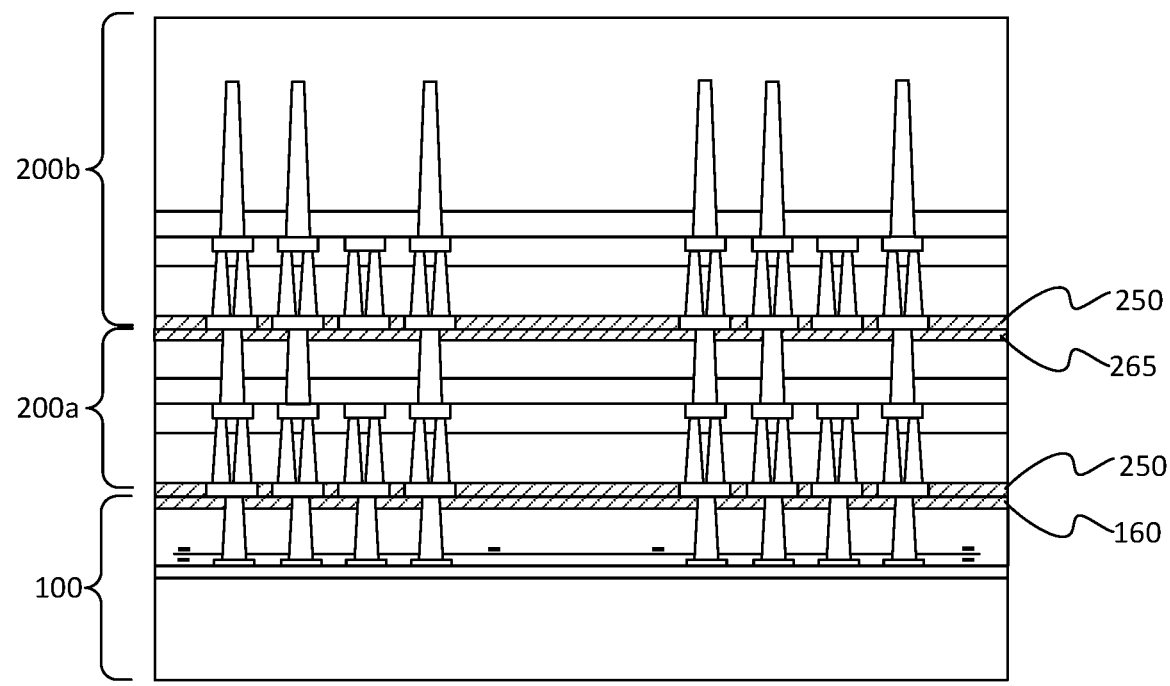

In FIG. 25, the wafer 200 becomes the wafer 200a, and another wafer 200b is bonded to the wafer 200a, in accordance with some embodiments. The wafer 200b may be bonded to the wafer 200a using a hybrid bonding technique such as described above, with respect to FIG. 20a. With each subsequent hybrid bonding technique, structures already bonded with a hybrid bonding technique may have their bond strengths increased with when the bonding anneal is performed. As such, in some embodiments, the bond strengths between different structures may be different.

Figure 26:
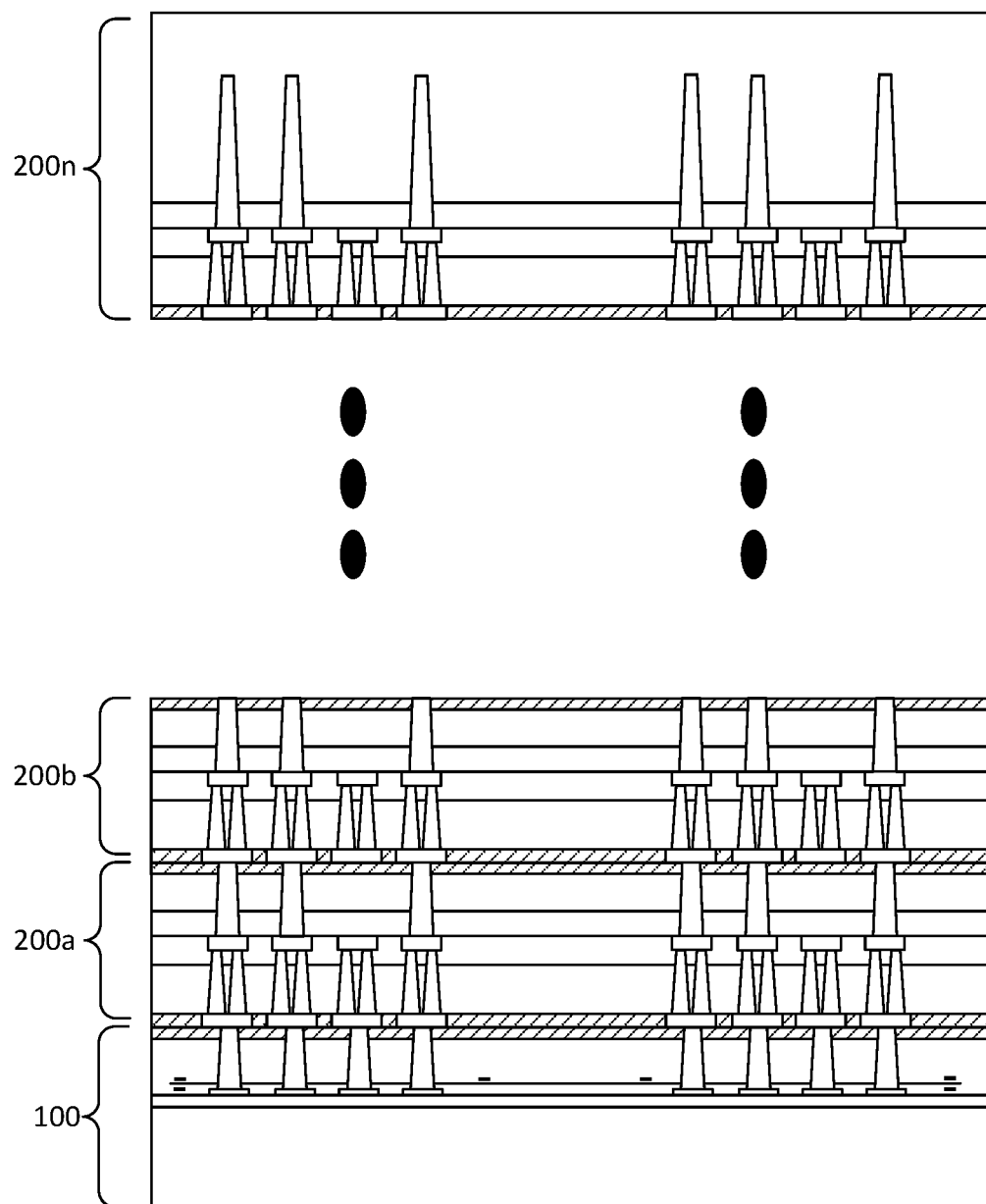

In FIG. 26, the thinning process and formation of a reverse bonding layer 265, such as described above with respect to FIGS. 21 through 24 may be repeated on the wafer 200b and additional wafers 200 up to wafer 200n may be stacked and bonded using hybrid bonding techniques as described above, with respect to FIG. 20a. The total number of wafers 200 may be between about 1 and 16 or more. In some embodiments, each wafer 200 may be bonded with a minimal bond anneal time, such as between 30 min and 60 min, until the last wafer 200n is bonded, where the bond anneal time is increased, thereby increasing the bond strength of the already bonded structures while reducing overall processing time. In some embodiments, the bond strength between the first bonded wafers will be greater than subsequently bonded wafers. For example, the bond strength between wafers 200a and 200b may be the greatest, then the bond strength between the wafers 200b and 200c, and so forth.

Figure 27:
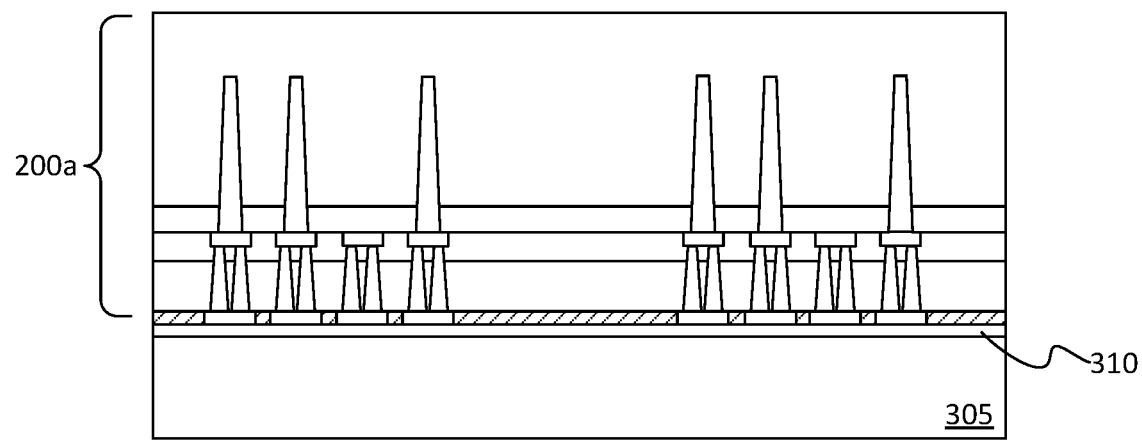
FIG. 27 through 30 illustrate a process of forming a two-layer wafer stack, in accordance with some embodiments.
Figure 28:
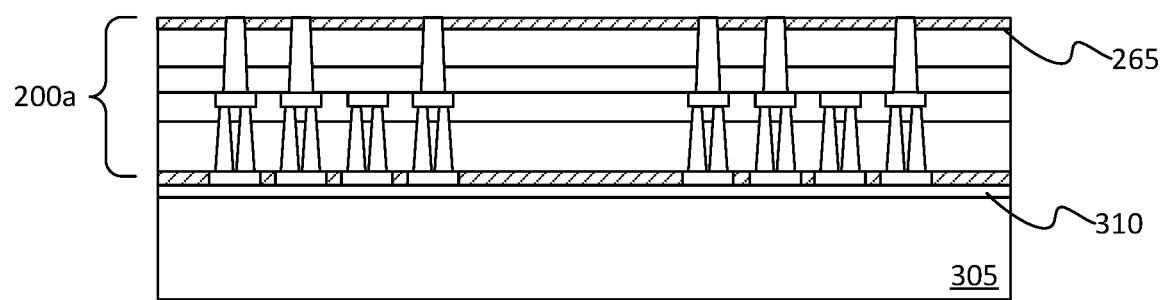

FIGS. 27 through 30 illustrate a process of forming a two-layer wafer stack 300 which may be used to attach to wafer 100, in accordance with some embodiments. In FIG. 27, the wafer 200 of FIG. 19 is attached to a carrier substrate 305 as wafer 200a by a release layer 310. The carrier substrate 305 and release layer 310 may be formed of materials similar to the carrier substrate 190 and release layer 150 described above with respect to FIGS. 3a, 3b, 3c, and 3d. In FIG. 28, the processes described above with respect to FIGS. 21 through 24 may be performed to thin wafer 200a and form the reverse bonding layer 265 of wafer 200a.

Figure 29:
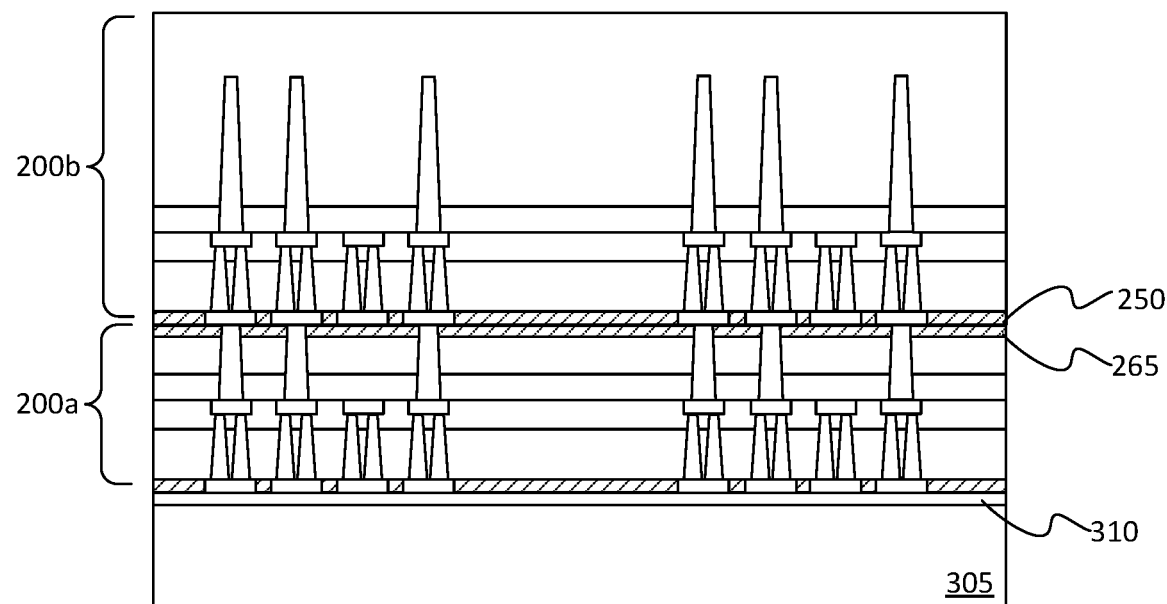
Figure 30:
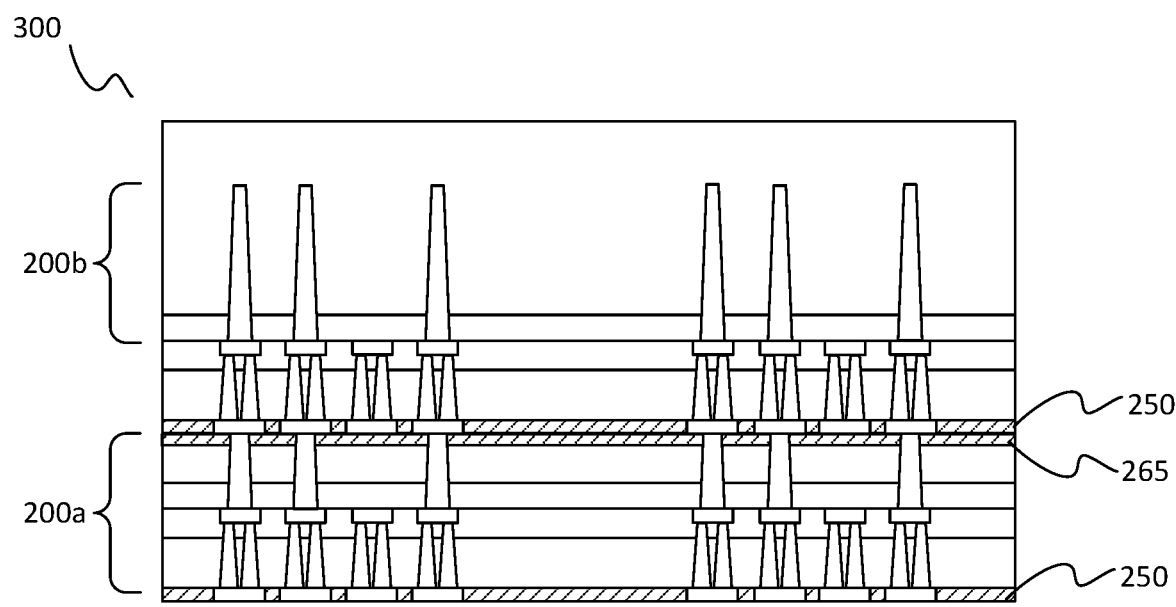

In FIG. 29 a second wafer 200b is bonded to the first wafer 200a by a hybrid bonding process, such as described above with respect to FIG. 20a. In FIG. 30, the carrier substrate 305 may be removed, thereby forming two-layer wafer stack 300. The carrier substrate 305 may be removed by applying UV radiation to release layer 310, a mechanical grinding process, an etch back process, a heating process, combinations thereof, or the like.

Figure 31:
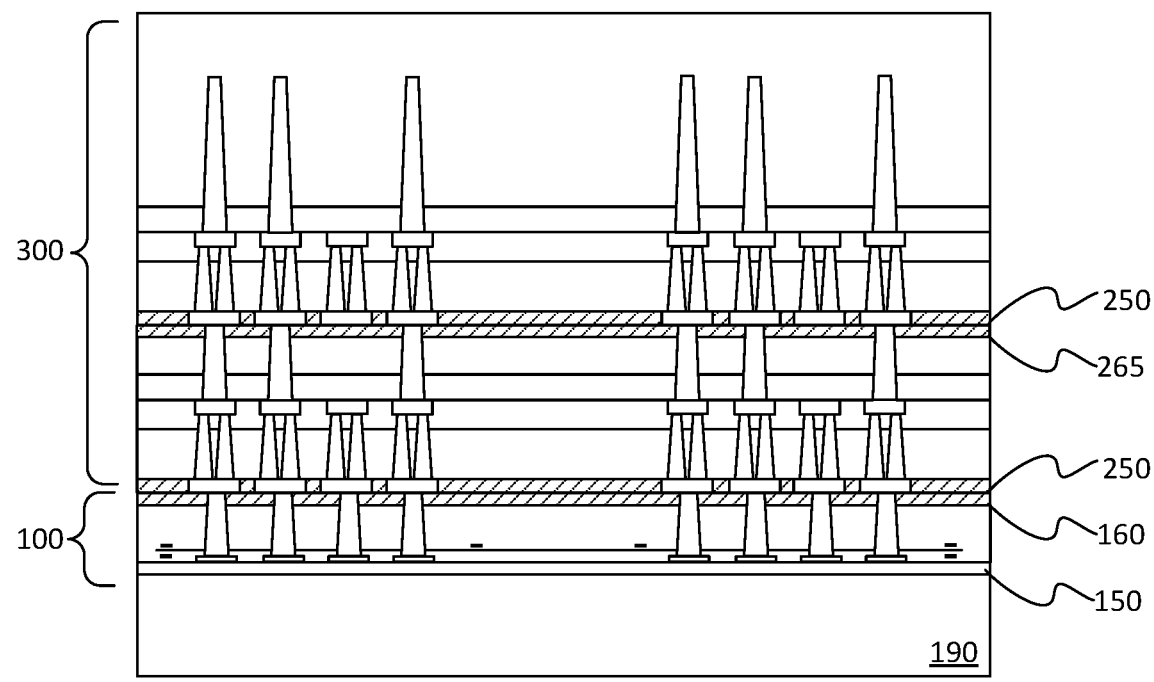
FIGS. 31 through 32 illustrate a process of using a two-layer wafer stack, in accordance with some embodiments.

In FIG. 31, the two-layer wafer stack 300 is bonded to the wafer 100, for example of FIG. 10. The two-layer wafer stack 300 may be bonded to the wafer 100 using a hybrid bonding process, such as described above with respect to FIG. 20a.

Figure 32:
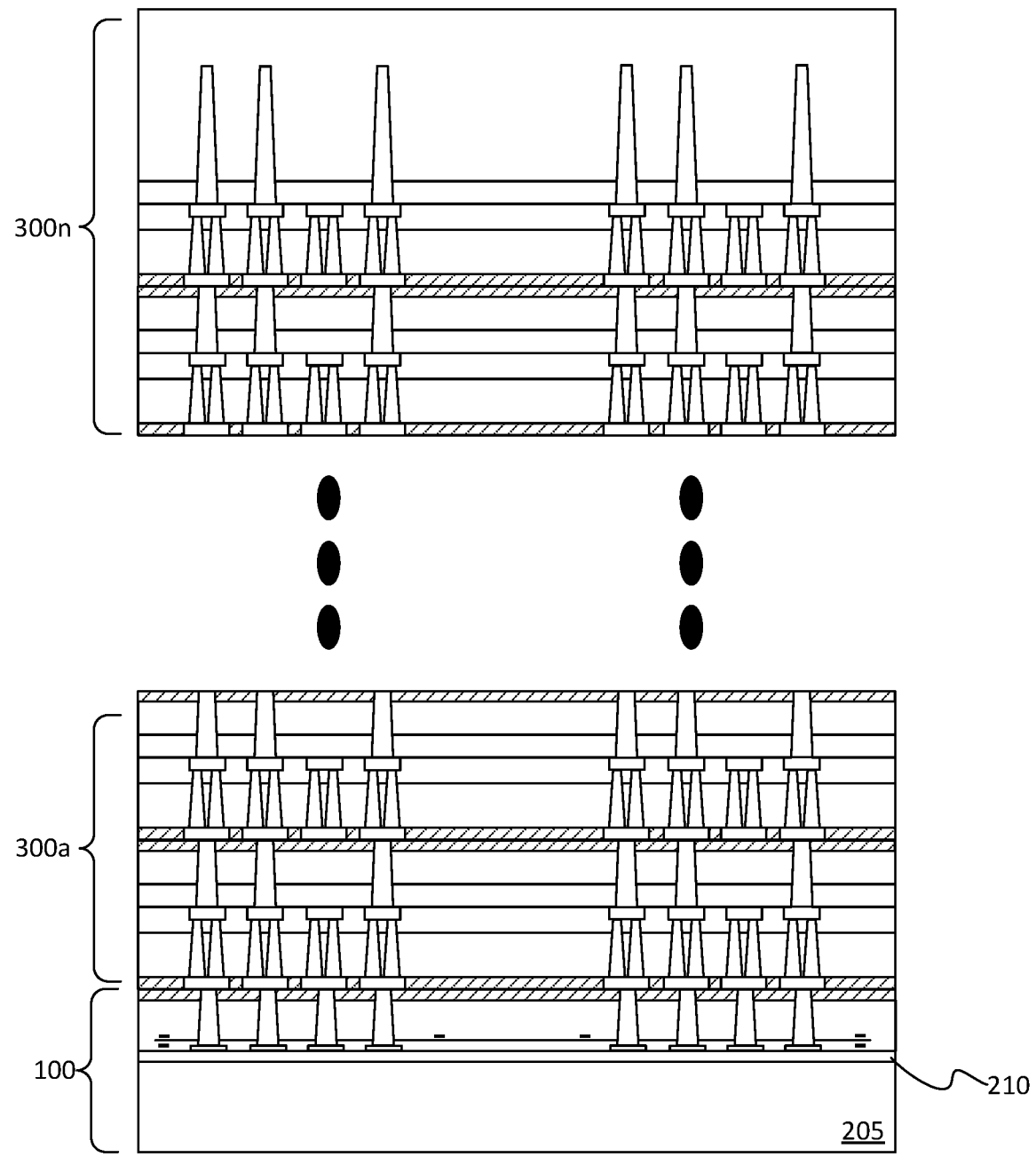

In FIG. 32, the two-layer wafer stack 300 becomes wafer stack 300a and the process of bonding a two-layer wafer stack 300 may be repeated for a desired number of times to bond a total of n two-layer wafer stacks 300 to the wafer 100. The total number of wafers 200 is 2 times n. Prior to bonding each additional two-layer wafer stack 300, the prior two-layer wafer stack 300 may be processed to thin the upper most wafer 200 of the two-layer wafer stack 300 and form the reverse bonding layer 265, such as described above with respect to FIGS. 21 through 24. In some embodiments, each wafer stack 300 may be bonded with a minimal bond anneal time, such as between 30 min and 60 min, until the last wafer stack 300n is bonded, where the bond anneal time is increased, thereby increasing the bond strength of the already bonded structures while reducing overall processing time. In some embodiments, the bond strength between each two-layer wafer stack 300 will be greater than subsequently bonded wafer stacks. For example, the bond strength between wafer stacks 300a and 300b may be the greatest, then the bond strength between the wafer stacks 300b and 300c, and so forth. Also, in some embodiments, the bond strength between the individual wafers 200 within the wafer stack 300 is greater than the bond strength between the wafer stacks 300.

Figure 33:
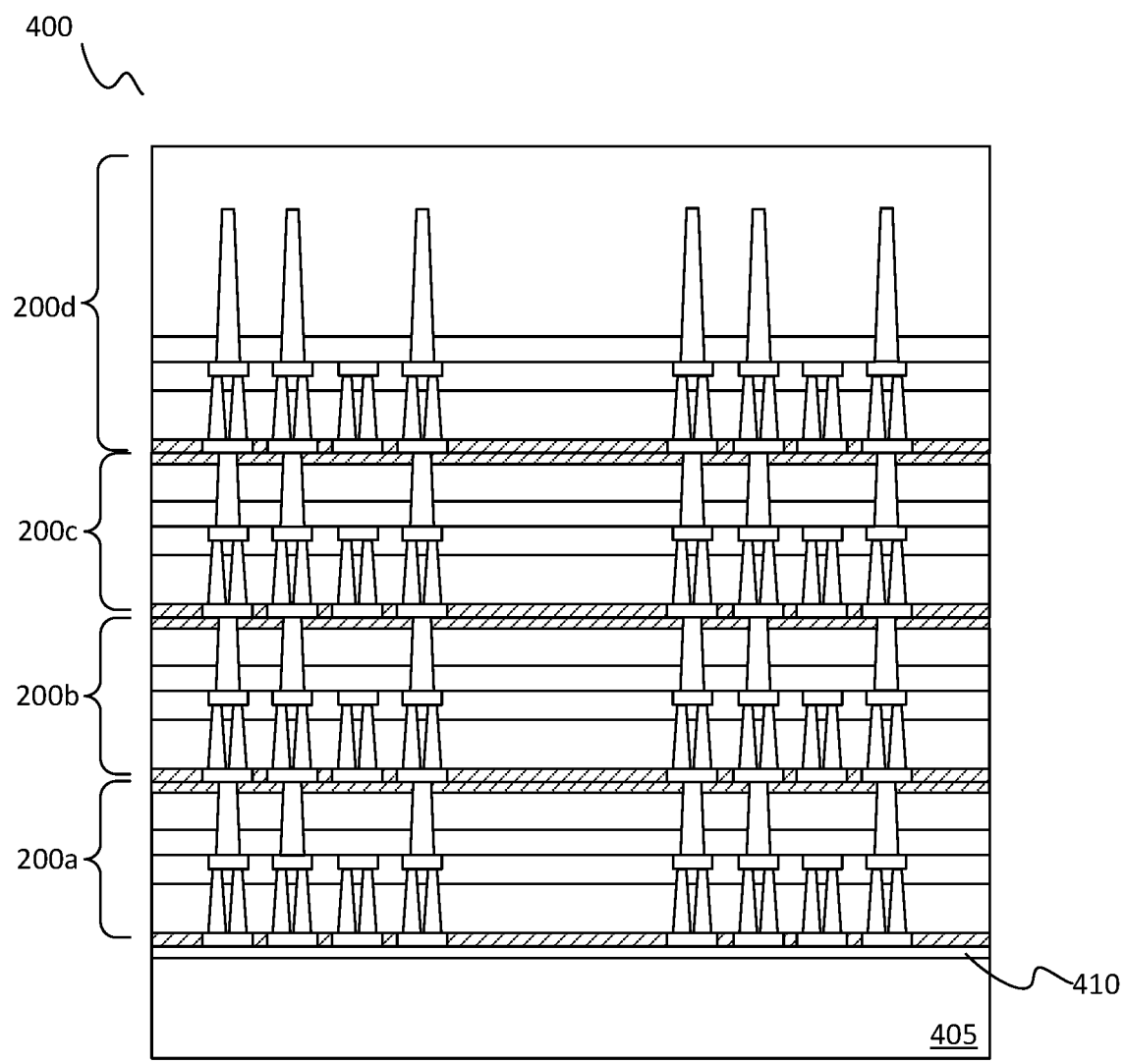
FIG. 33 through 34 illustrate a process of forming a four-layer wafer stack, in accordance with some embodiments.

In FIG. 33, a four-layer wafer stack 400 is formed from individual wafers 200, including wafer 200a, wafer 200b, wafer 200c, and wafer 200d, in accordance with some embodiments. The four-layer wafer stack 400 may be formed by continuing the process of adding additional wafers 200, for example, to the structure of FIG. 29. Prior to bonding each additional wafer 200, the prior wafer 200 may be processed to thin the wafer 200 and form the reverse bonding layer 265, such as described above with respect to FIGS. 21 through 24. In some embodiments, each wafer 200 may be bonded with a minimal bond anneal time, such as between 30 min and 60 min, until the last wafer 200d is bonded, where the bond anneal time is increased, thereby increasing the bond strength of the already bonded structures while reducing overall processing time.

Figure 34:
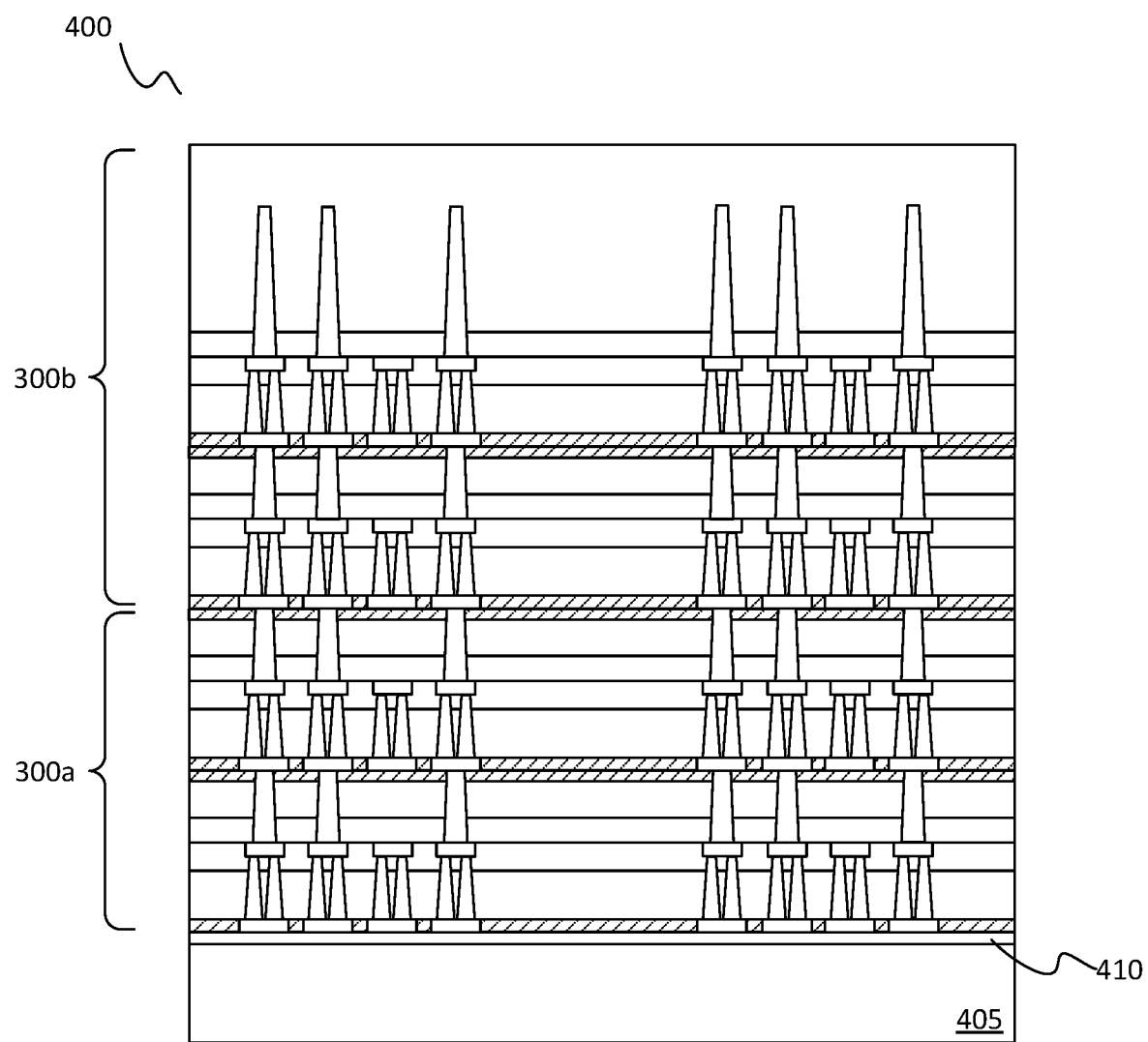

In FIG. 34, a four-layer wafer stack 400 is formed from two-layer wafer stacks 300, in accordance with some embodiments. The four-layer wafer stack 400 of FIG. 34 may be formed by adding an additional two-layer wafer stack 300 (see FIG. 30), for example, to the structure of FIG. 29. In another embodiment, a two-layer wafer stack 300, for example of FIG. 30, may be attached to a carrier substrate, followed by another two-layer wafer stack 300 or by two wafers 200 bonded to the first two-layer wafer stack 300. In another embodiment, a two-layer wafer stack 300 may be bonded to a wafer 200, for example, the structure of FIG. 28 followed by another wafer 200. Prior to bonding each additional wafer 200 or two-layer wafer stack 300, the prior wafer 200 or upper wafer 200 of the two-layer wafer stack 300 may be processed to thin the wafer 200 and form the reverse bonding layer 265, such as described above with respect to FIGS. 21 through 24.

Figure 35:
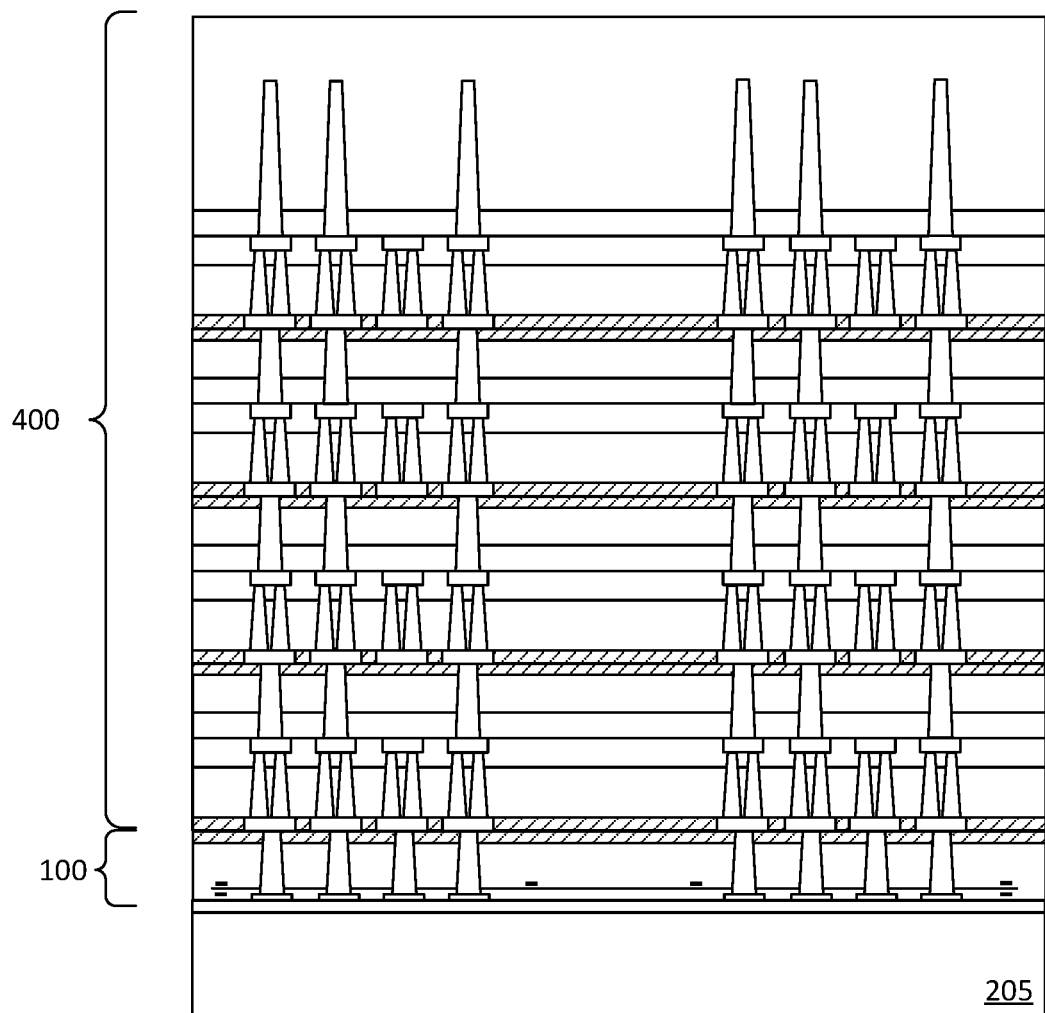
FIGS. 35 through 36 illustrate a process of using a four-layer wafer stack, in accordance with some embodiments.

In FIG. 35, the carrier substrate 405 may be removed, thereby forming the four-layer wafer stack 400. The four-layer wafer stack 400 is bonded to the wafer 100, for example of FIG. 10. The four-layer wafer stack 400 may be bonded to the wafer 100 using a hybrid bonding process, such as described above with respect to FIG. 20a.

Figure 36:
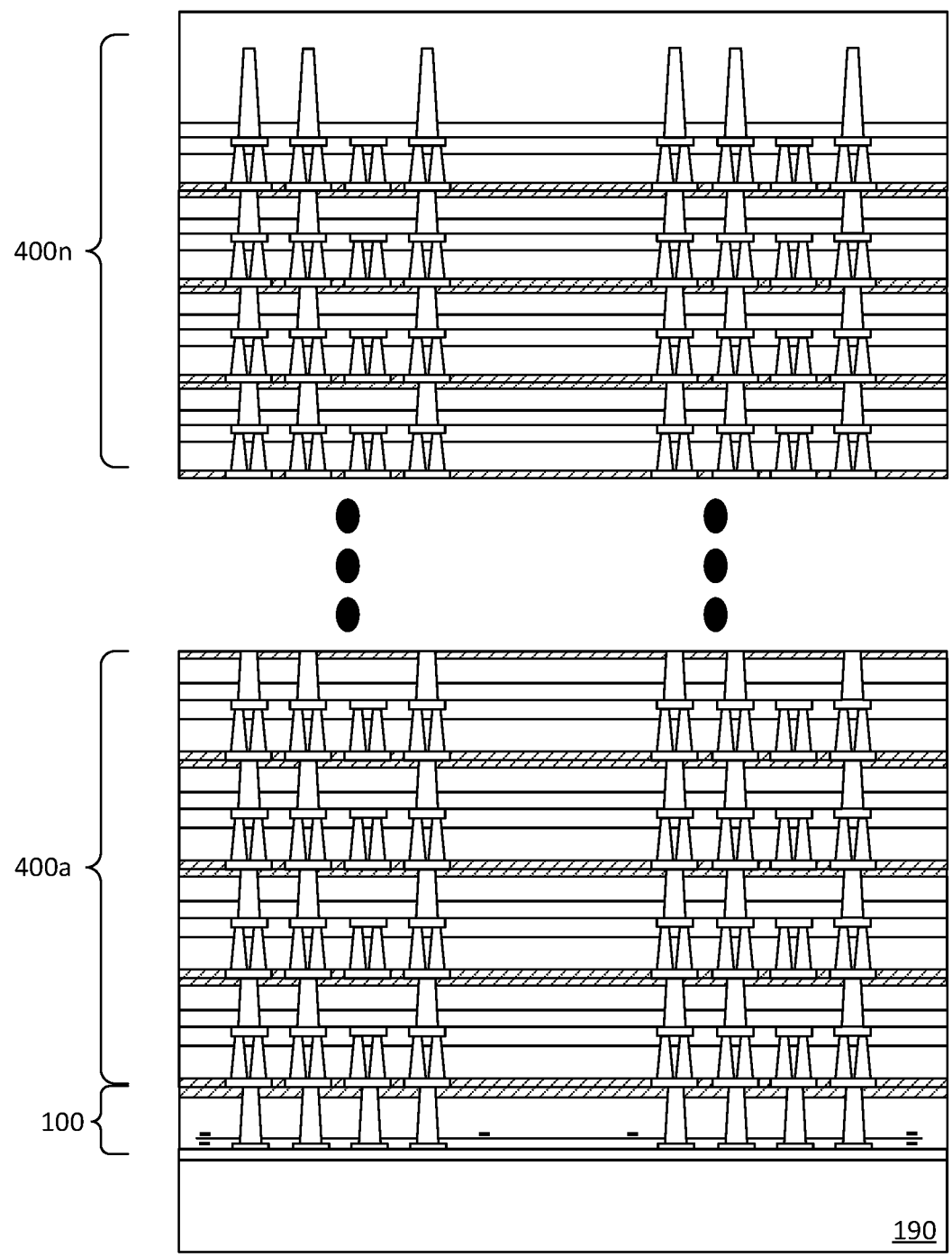

In FIG. 36, the four-layer wafer stack 400 becomes wafer stack 400a and the process of bonding a four-layer wafer stack 400 may be repeated for a desired number of times to bond a total of n four-layer wafer stacks 400 to the wafer 100. The total number of wafers 200 is 4 times n. Prior to bonding each additional four-layer wafer stack 400, the prior four-layer wafer stack 400 may be processed to thin the upper most wafer 200 of the four-layer wafer stack 400 and form the reverse bonding layer 265, such as described above with respect to FIGS. 21 through 24. In some embodiments, each wafer stack 400 may be bonded with a minimal bond anneal time, such as between 30 min and 60 min, until the last wafer stack 400n is bonded, where the bond anneal time is increased, thereby increasing the bond strength of the already bonded structures while reducing overall processing time. In some embodiments, the bond strength between each four-layer wafer stack 400 will be greater than subsequently bonded wafer stacks 400. For example, the bond strength between wafer stacks 400a and 400b may be the greatest, then the bond strength between the wafer stacks 400b and 400c, and so forth. Also, in some embodiments, the bond strength between the individual wafers 200 within each wafer stack 400 is greater than the bond strength between the wafer stacks 400.

In FIGS. 37a, 37b, 37c, and 37d, any combination of wafer 200, two-layer wafer stack 300, and/or four-layer wafer stack 400 in any number and in any order may be bonded to the wafer 100 flowing from FIGS. 3a and 3b or the wafer 100' flowing from FIGS. 3c and 3d. It is noted that in FIGS. 37b and 37d the dielectric layer 132 may be synonymous with the bonding layer 160. In some embodiments, the wafer 100' may be modified to add an upper bonding layer 160 over the gap fill material 155 by recessing the gap fill material 155 and depositing the bonding layer 160 where the gap fill material 155 was removed. In other embodiments, the wafer 100' may be modified to add an upper bonding layer 160 over the gap fill material 155 by depositing an bonding layer 160 over the gap fill material 155 and over the dies 112, forming openings in the bonding layer 160 exposing the contact pads 125 and extending the contact pads 125 through the openings in the bonding layer 160. These processes are described above with respect to FIGS. 5 through 6 and FIGS. 8 through 10 and may be modified as necessary from those embodiments.

In some embodiments, each wafer 200, two-layer wafer stack 300, or four-layer wafer stack 400 may be bonded with a minimal bond anneal time, such as between 30 min and 60 min, until the last wafer 200 or wafer stack 300 or 400 is bonded, where the bond anneal time is increased, thereby increasing the bond strength of the already bonded structures while reducing overall processing time.

The total number of wafers 200 may be determined by the combination of the single wafers 200, two-layer wafer stacks 300, and, four-layer wafer stacks 400. For example, the total number of wafers 200 may be between one wafer 200 and about twenty wafers 200. Prior to bonding each additional wafer 200, two-layer wafer stack 300, or four-layer wafer stack 400, the prior wafer 200, two-layer wafer stack 300, or four-layer wafer stack 400 may be processed to thin the upper most wafer 200 and form the reverse bonding layer 265, such as described above with respect to FIGS. 21 through 24.

In an embodiment, each wafer 200 may be a memory wafer and a stack of wafers 200 may make up a memory cube. The memory cube may include, for example, eight wafers 200. In some embodiments, one or more extra wafers 200 may be included over a designed number of wafers 200 to provide back up capacity should one or more of the wafers 200 test bad. For example, in an embodiment, nine wafers 200 may be bonded to the wafer 100 or wafer 100', which may be a memory controller. When one of the nine wafers 200 is determined to be defective, the memory controller may be programmed to bypass the defective wafer 200 without losing functionality of the whole memory/controller combination.

In some embodiments, one or more of the different layers of wafers 200 may have different functionalities.

Figure 38A:
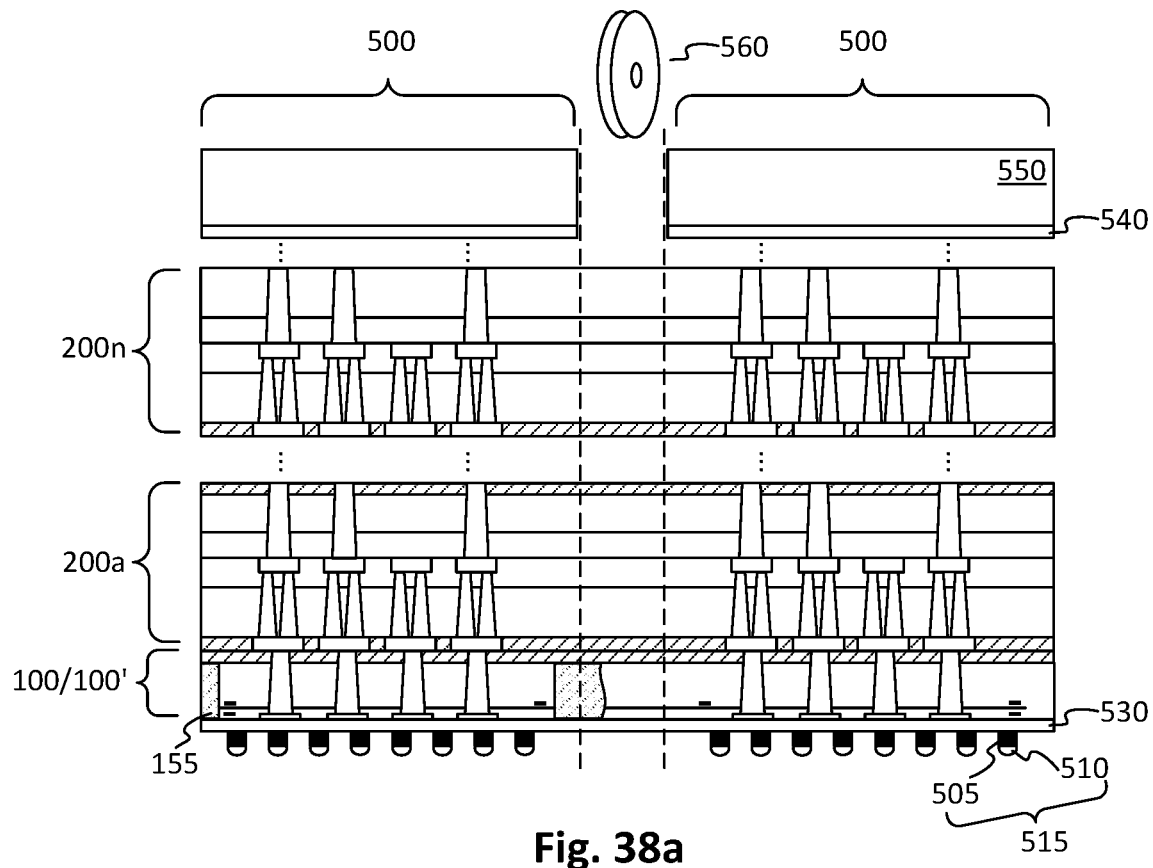
FIGS. 38a through 38b illustrate a process of forming a package using a one-layer, two-layer, and/or four-layer stack, in accordance with some embodiments.

In FIG. 38a, after thinning the uppermost wafer 200 (i.e., wafer 200n), the carrier substrate 190 is removed, the packages 500 are singulated from each other, and connectors 515 are formed on the front side of the wafer 100/100'. These processes may be performed in any suitable order. In some embodiments, the carrier substrate 190 is removed, the connectors 515 formed, and then the packages 500 singulated. In other embodiments, the packages 500 are singulated with the carrier substrate 190 on, then the carrier substrate 190 is removed, and the connectors 515 are formed. These processes are described in greater detail below.

Also illustrated in FIG. 38a is an optional thermal interface material (TIM) 540 and heat dissipation structure 550, which is described in greater detail below. FIG. 38a also includes an optional redistribution structure 530, which may be formed using materials and processes similar to those described above with respect to the interconnect structure 130, which are not repeated.

The packages 500 may be singulated using any suitable cutting technique 560. Cutting technique 560 can include a dry etch, wet etch, anisotropic etch, or plasma etch using suitable etchants. Cutting technique 560 can include a laser making multiple passes to laser dice the packages 500 from one another. Cutting technique 560 can include a mechanical process, such as a saw set to cut to a desired depth. A combination of the above described cutting techniques 560 may also be used. Singulation occurs through the non-package regions (outside package 500 areas, see, e.g., dicing lanes 111 of FIG. 1 and dicing lanes 211 of FIG. 11). The singulation cuts through the processed wafer stacks, down to the release layer 150. In some embodiments, the singulation can continue through the release layer 150 and may continue into or through the carrier substrate 190.

Connectors 515 are formed on a front side of the wafer 100. Connectors 515 can be formed using any suitable process and comprise various configurations. In some embodiments, the connectors 515 may be controlled collapse chip connection (C4) bumps, micro-bumps, solder balls, or the like. For example, openings (not shown) can be made in a passivation layer deposited on the front side of the wafer 100, the opening exposing metal features, such as contact pads 125 of the wafer 100 or metal lines of the optional redistribution structure 530. Connectors 515 are formed in the openings. In some embodiments, an under bump metallurgy (UBM) layer can be formed in the openings prior to the formation of the connectors 515. In the illustrated embodiment, the connectors 515 have lower portions 505 (closer to the wafer 100) comprising a conductive material and upper portions 510 (further from the wafer 100) comprising a solder material. The lower portions 505 and the upper portions 510 may be also referred as conductive pillars 505 and solder caps 510, respectively.

Connectors 515 can be coupled to conductive features of the wafer 100, and also to various ones of the wafers 200a through 200n by the vias 120/220, the bond pad vias 245, and the interconnect structures 130, 230, and/or 530.

The optional thermal interface material (TIM) 540 is formed over the packages 500. The TIM 540 is a material having a good thermal conductivity, which may be greater than about 5 W/m*K, and may be equal to, or higher than, about 50 W/m*K or 100 W/m*K. The optional heat dissipation structure 550 may be attached by the TIM 540 which may also have adhesive qualities. The heat dissipation structure 550 has a high thermal conductivity and may be formed using a metal, a metal alloy, or the like. For example, the heat dissipation structure 550 may comprise a metal, such as Al, Cu, Ni, Co, and the like, or an alloy thereof. The heat dissipation structure 550 may also be formed of a composite material selected from the group consisting of silicon carbide, aluminum nitride, graphite, and the like. The heat dissipation structure 550 may be used to dissipate heat through each of the bonded wafers 100/100' and wafers 200. The through vias 120 of the wafer 100/100' and the through vias 220 of the wafer 200 may efficiently dissipate heat generated from the device regions 110 (see FIG. 2) and/or device regions 210 (see FIG. 12). If the through vias 120 and through vias 220 are aligned, such as illustrated, the heat dissipation efficiency may be increased. Embodiments also contemplate, however, that the through vias 120 and through vias 220 may not be aligned or may be omitted as necessary depending on the design of the device regions 110 and device regions 210, and routing of metal lines and vias in the interconnect structures 130 and 230.

Figure 37A:
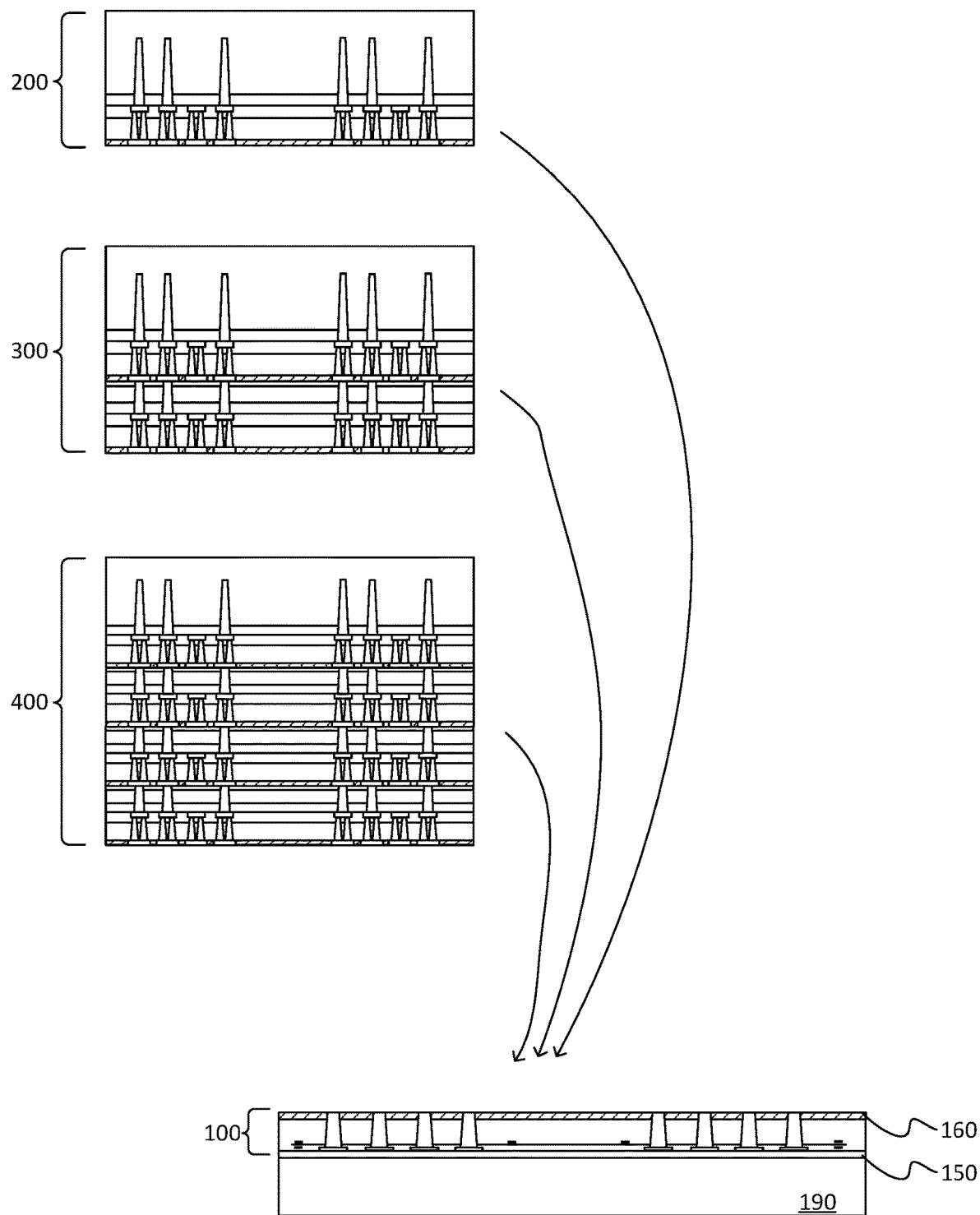
FIGS. 37a through 37d illustrate a process of using a one-layer, two-layer, and/or four-layer stack, in accordance with some embodiments.
Figure 37B:
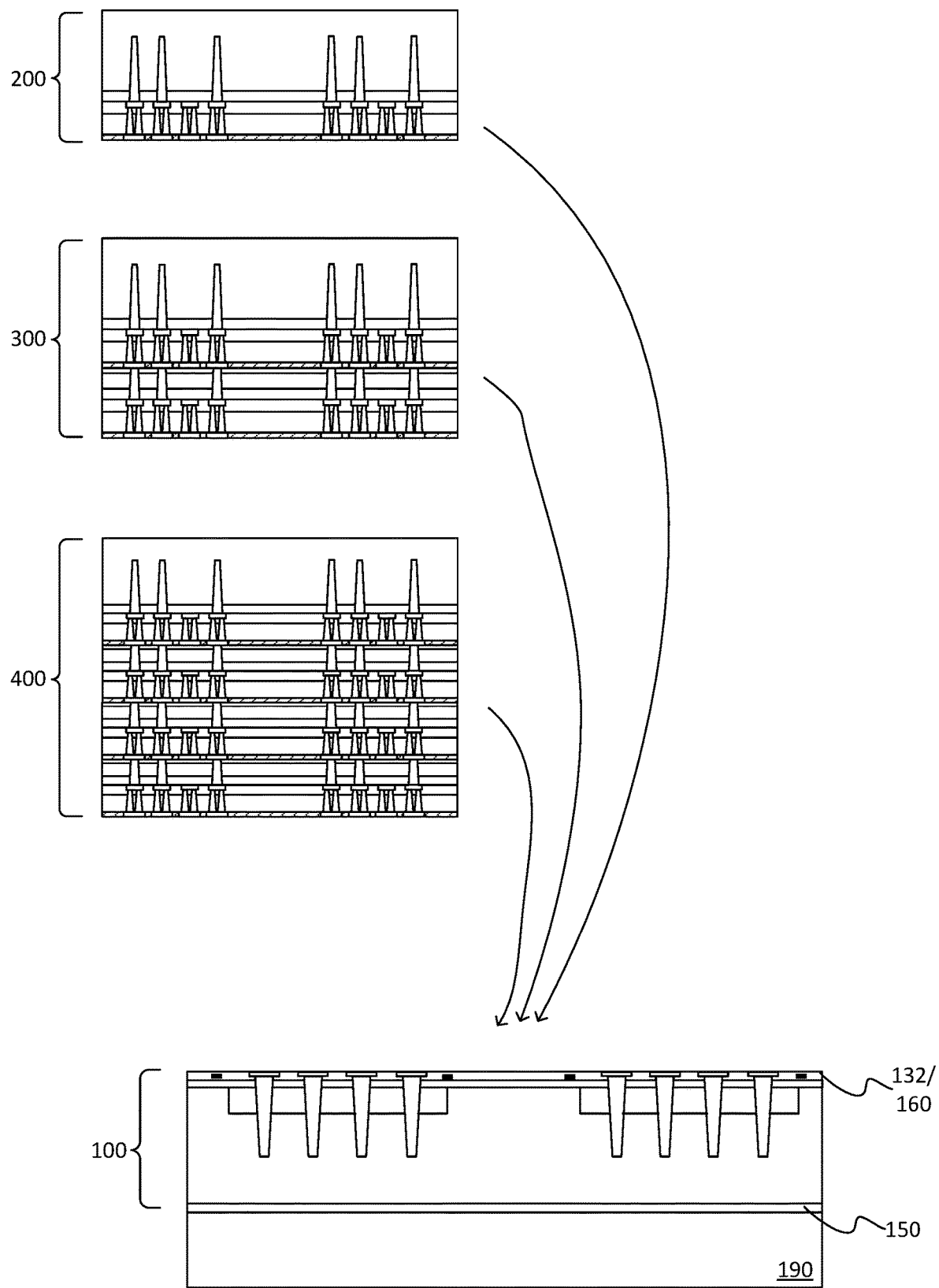
Figure 37C:
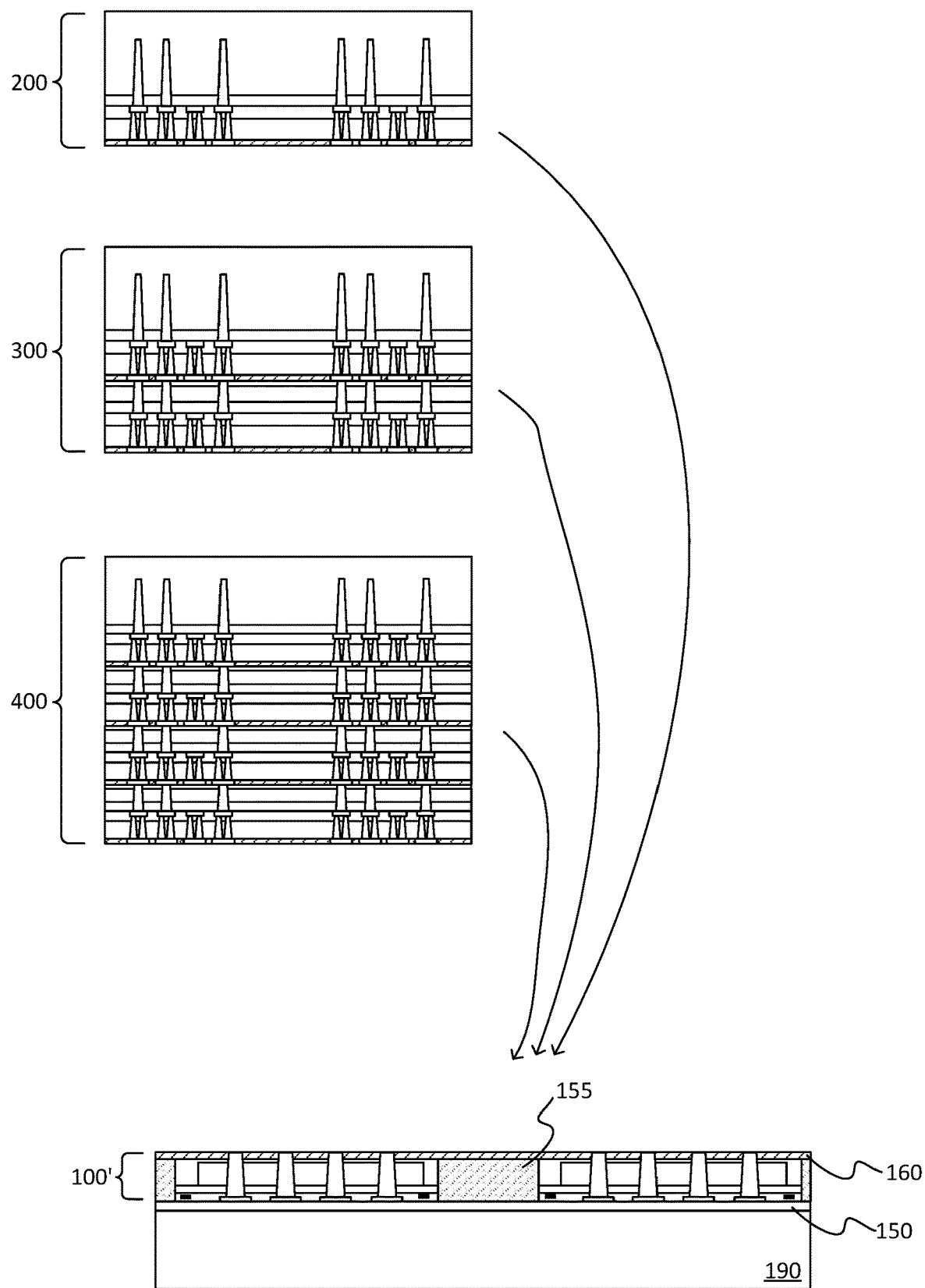
Figure 37D:
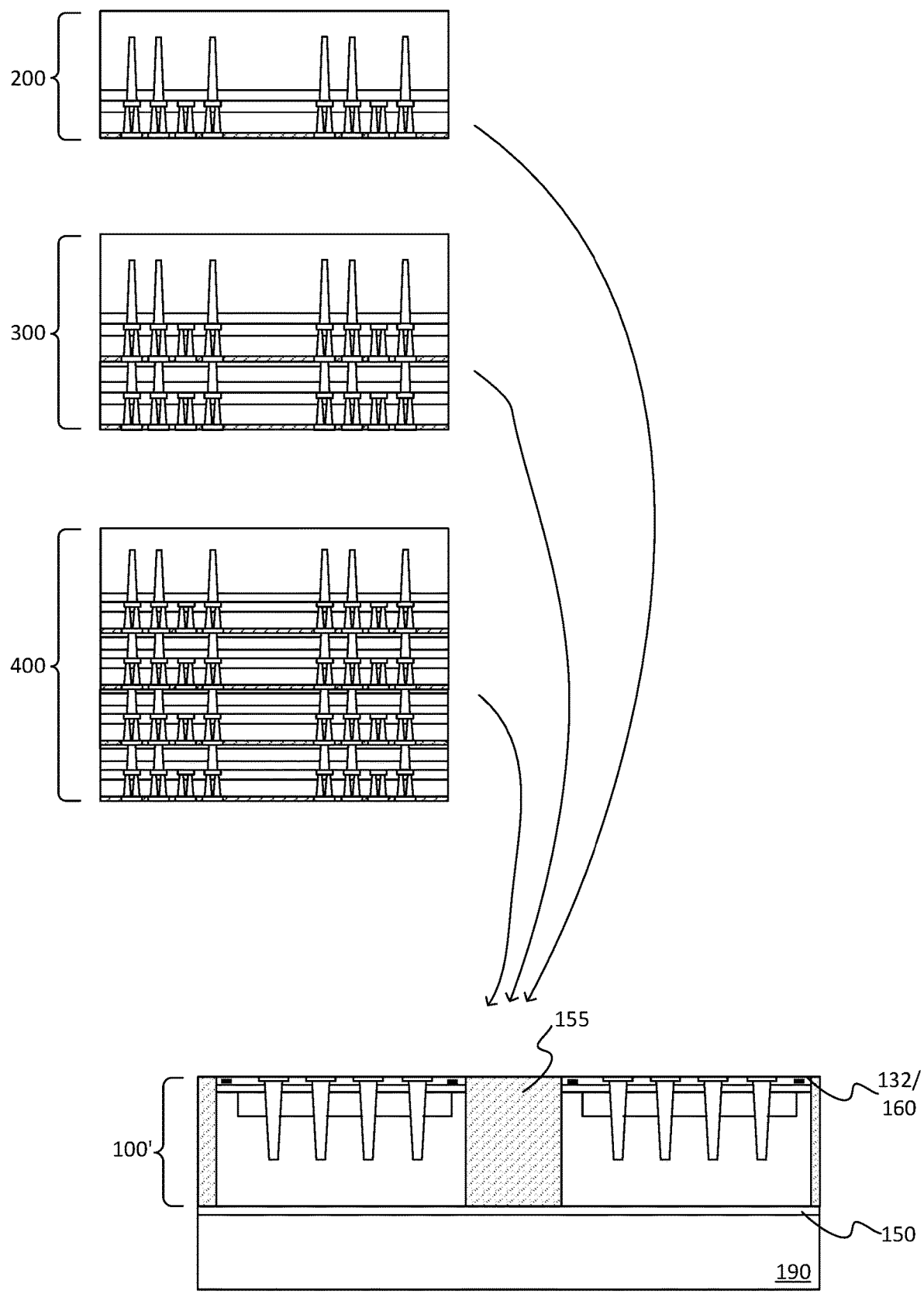
Figure 38B:
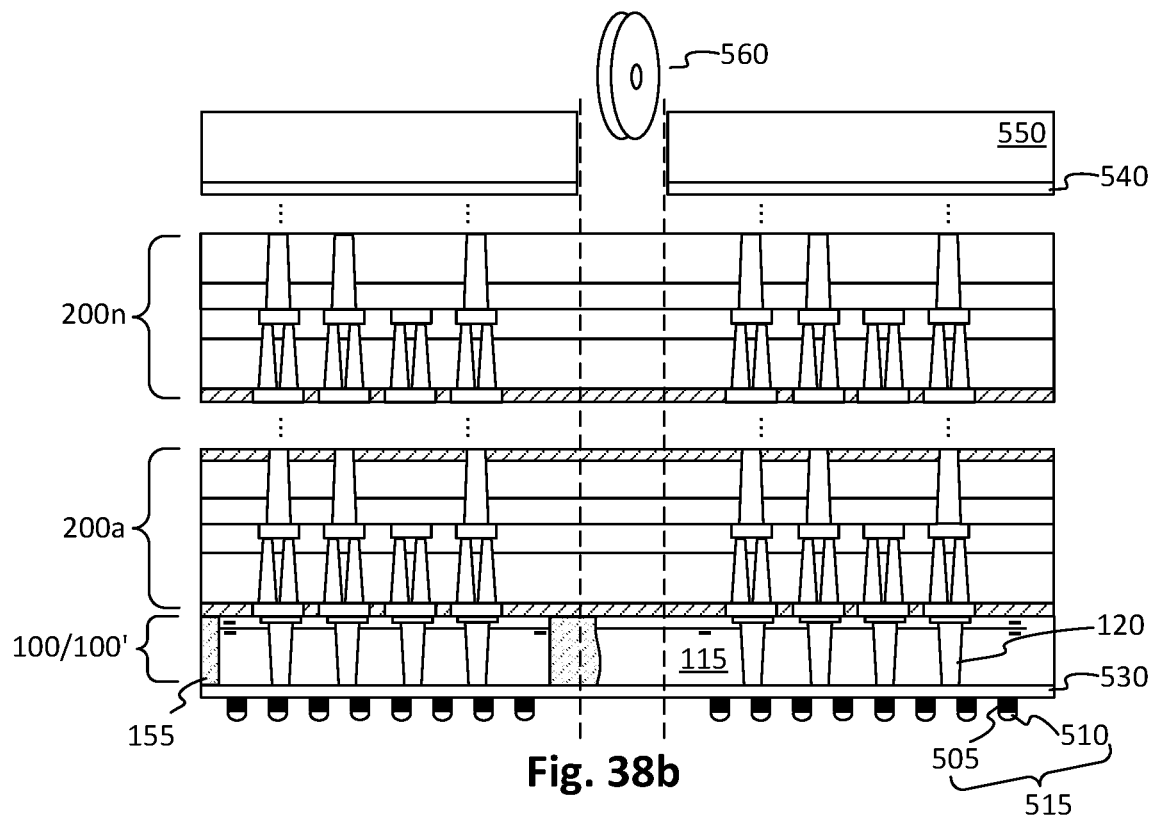

FIG. 38b is similar to FIG. 38a, except that the wafer 100/100' is face up so that the back side of the wafer is face down (such as illustrated in FIGS. 37b and 37d. In such embodiments, the carrier substrate 190 can be removed, and the substrate 115 of wafer 100 thinned to expose the vias 120. Then, a redistribution structure 530 may be formed to route the vias 120 as needed at the back of the wafer 100/100' or front of the packages 500. The redistribution structure 530 may be formed using processes and materials similar to the interconnect structure 130 described above with respect to FIG. 2. The packages 500 may then be singulated, connectors 515 formed, TIM 540 formed, and heat dissipation structure 550 applied in a manner similar to that described above with respect to FIG. 38a.

FIGS. 38a and 38b also provide a combined view for wafer 100/100' that illustrates both wafer 100 and wafer 100' from FIGS. 37a, 37b, 37c, and 37d. In particular, the gap fill material 155 is illustrated on the left half of FIGS. 38a and 38b, following from FIGS. 37c and 37d, while the gap fill material 155 is not used on the right half of FIGS. 38a and 38b, following from FIGS. 37a and 37b.

Embodiments include a wafer-to-wafer hybrid bonding stacking process to provide great flexibility in forming a packaged device having multiple functions. To achieve high quality bonding of the wafer to wafer, a bonding layer can be formed on adjoining pieces to provide a fusion bonding between bonding layers which is less prone to failure than other bonding processes. The metal features of the wafers can be aligned flexibly by providing a target contact area (e.g., a contact pad) larger than an adjoining metal feature which may be, for example, a portion of a through-via. Additionally, the metal features, such as through-vias may be used to route signals and/or dissipate heat through the entire package structure.

One embodiment is a method including thinning a first wafer to expose metal vias. A bonding layer is formed over the metal vias, the metal vias extending through the bonding layer. A second wafer is pressed to the first wafer, where bond pads of the second wafer align to the metal vias of the first wafer, and the bond pads of the second wafer are bonded with the metal vias of the first wafer without using a bonding material between the bond pads and the metal vias. The bonding layer of the first wafer is fused to a bonding layer of the second wafer. In an embodiment, forming the bonding layer may include: recessing a first material surrounding the metal vias; depositing a second material corresponding to the bonding layer; and planarizing the second material to level an upper surface of the second material with upper surfaces of the metal vias. In an embodiment, forming the bonding layer may include: depositing the bonding layer over the metal vias; forming openings in the bonding layer, the openings corresponding to the metal vias; depositing a metal via extension in the openings, the metal via extension being physically coupled to the metal vias; and planarizing the metal via extension to level an upper surface of the bonding layer with upper surfaces of the metal via extensions. In an embodiment, the first wafer and second wafer together form a first wafer stack, and may further include: pressing the first wafer stack to a third wafer, where bond pads of the first wafer align to metal features of the third wafer; bonding the bond pads of the first wafer with the metal features of the third wafer without using a bonding material between the bond pads and the metal features; and fusing a bonding layer of the first wafer to a bonding layer of the third wafer. In an embodiment, the first wafer may include a controller for controlling devices in the first wafer stack. In an embodiment, the first wafer is face down and the third wafer is face up, a face of the third wafer being bonded to a face of the first wafer. In an embodiment, the method may include: singulating a stacked device package from the first wafer and second wafer. In an embodiment, the first wafer and second wafer together form a first wafer stack, and the method may further include: forming a second wafer stack including a two-layer wafer stack; thinning the second wafer to expose second metal vias of the first wafer stack; forming a second bonding layer over the second metal vias, the second metal vias extending through the second bonding layer; pressing a the second wafer stack to the first wafer stack, where bond pads of the second wafer stack align to the second metal vias; bonding the bond pads of the second wafer stack with the second metal vias of the first wafer stack without using a bonding material between the bond pads of the second wafer stack and the second metal vias; and fusing the second bonding layer to a bonding layer of the second wafer stack to form a first four-level wafer stack. In an embodiment, the method includes positioning the first four-level wafer stack to a third wafer, where bond pads of the first four-level wafer stack align to metal features of the third wafer; bonding bond pads of the first four-level wafer stack to metal features of the third wafer without using a bonding material between the bond pads and the metal features; and fusing a bonding layer of the first four-level wafer stack to a bonding layer of the third wafer. In an embodiment, each of the wafers in the first four-level wafer stack are face down. In an embodiment, the bonding layer of the first wafer is between 0.8 µm and 3 µm thick.

Another embodiment is a package including a first device, a second device, and a third device. The first device may include a first set of vias, first active devices, and a first interconnect structure, the first set of vias traversing from a front of the first device through the first interconnect structure to a back of the first device, the first active devices adjacent the first interconnect structure. The second device may include a second set of vias, second active devices, a second interconnect structure, a second front bonding layer, and a second reverse bonding layer, the second reverse bonding layer being on a back side of the second device, the second reverse bonding layer may include a first dielectric material, the second front bonding layer being bonded to the first device, where the second set of vias traverse from the second front bonding layer through the second reverse bonding layer. The third device may include a third set of vias, third active devices, a third interconnect structure, and a third front bonding layer, the third front bonding layer may include a same dielectric material as the first dielectric material, where the third set of vias traverse from the third front bonding layer through the third device to a back side of the third device, where the second reverse bonding layer is bonded to the third front bonding layer. In an embodiment, the third front bonding layer may include a set of bond pad vias and a set of bond pads, where each of the bond pads has an interface with a corresponding via of the second set of vias. In an embodiment, the package may include: a thermal interface material disposed on the third device, the thermal interface material in contact with the third set of vias, and a heat dissipation feature disposed over the thermal interface material. In an embodiment, the first device is laterally surrounded by a gap fill material, where the second front bonding layer overlaps the gap fill material. In an embodiment, the first device further may include a first set of bond pads electrically coupled to the first set of vias, where the first set of bond pads are directly bonded to second bond pads disposed on the second front bonding layer. In an embodiment, the second front bonding layer and second reverse bonding layer are each between 0.8 µm and 3 µm thick.

Another embodiment is a package component that includes a first wafer bonded to a second wafer, wherein at a bonding interface, metal vias of the first wafer are directly bonded to bond pads of the second wafer and a first bonding layer of the first wafer is fused to a second bonding layer of the second wafer, the first bonding layer disposed at a back side of the first wafer, the metal vias of the first wafer traversing through the first bonding layer, through a semiconductor substrate, and through a first interconnect of the first wafer. In an embodiment, the package component may include: a third wafer, a fourth bonding layer of the third wafer bonded to a third bonding layer of the second wafer; and a fourth wafer, a sixth bonding layer of the fourth wafer bonded to a fifth bonding layer of the third wafer. In an embodiment, each of the first wafer, second wafer, third wafer, and fourth wafer are face down. In an embodiment, the bond pads of the second wafer are coupled through the second bonding layer by bond pad vias to a second interconnect of the second wafer. In an embodiment, a first dielectric material of the first bonding layer is the same as a second dielectric material of the second bonding layer, and the first bonding layer and the second bonding layer are each between 0.8 µm and 3 µm thick.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
thinning a first wafer to expose metal vias;

forming a bonding layer over the metal vias, the metal vias extending through the bonding layer;
positioning a second wafer to the first wafer, wherein bond pads of the second wafer align to the metal vias of the first wafer;
bonding the bond pads of the second wafer with the metal vias of the first wafer without using a bonding material between the bond pads and the metal vias;
fusing the bonding layer of the first wafer to a bonding layer of the second wafer, to form a first wafer stack;
positioning the first wafer stack to a third wafer, wherein bond pads of the first wafer align to metal features of the third wafer;
bonding the bond pads of the first wafer with the metal features of the third wafer without using a bonding material between the bond pads and the metal features; and
fusing a bonding layer of the first wafer to a bonding layer of the third wafer.

2. The method of claim 1, wherein forming the bonding layer comprises:
recessing a first material surrounding the metal vias;
depositing a second material corresponding to the bonding layer; and
planarizing the second material to level an upper surface of the second material with upper surfaces of the metal vias.

3. The method of claim 1, wherein forming the bonding layer comprises:
depositing the bonding layer over the metal vias;
forming openings in the bonding layer, the openings corresponding to the metal vias;
depositing a metal via extension in the openings, the metal via extension being physically coupled to the metal vias; and
planarizing the metal via extension to level an upper surface of the bonding layer with upper surfaces of the metal via extensions.

4. The method of claim 1, wherein the first wafer comprises a controller for controlling devices in the first wafer stack.

5. The method of claim 1, wherein the first wafer is face down and the third wafer is face up, a face of the third wafer being bonded to a face of the first wafer.

6. The method of claim 1, wherein the bonding layer of the first wafer is between 0.8 µm and 3 µm thick.

7. The method of claim 1, wherein the first wafer and second wafer together form a first wafer stack, further comprising:
forming a second wafer stack comprising a two-layer wafer stack, the two-layer wafer stack including the third wafer;
thinning the second wafer to expose second metal vias of the first wafer stack;
forming a second bonding layer over the second metal vias, the second metal vias extending through the second bonding layer;
positioning the second wafer stack to the first wafer stack, wherein bond pads of the second wafer stack align to the second metal vias;
bonding the bond pads of the second wafer stack with the second metal vias of the first wafer stack without using a bonding material between the bond pads of the second wafer stack and the second metal vias; and
fusing the second bonding layer to a bonding layer of the second wafer stack to form a first four-level wafer stack.

8. The method of claim 7, further comprising:
positioning the first four-level wafer stack to a fourth wafer, wherein bond pads of the first four-level wafer stack align to metal features of the fourth wafer;
bonding the bond pads of the first four-level wafer stack with the metal features of the fourth wafer without using a bonding material between the bond pads and the metal features; and
fusing a bonding layer of the first four-level wafer stack to a bonding layer of the fourth wafer.

9. The method of claim 7, wherein each wafer in the first four-level wafer stack are face down.

10. A method comprising:
forming a first bonding layer on a backside of a first wafer, comprising:
recessing the backside of the first wafer to expose a first via of the first wafer, a portion of the first via protruding from the backside of the first wafer,
depositing the first bonding layer, and
planarizing the first bonding layer to level an upper surface of the first via with an upper surface of the first bonding layer;
fusing a second bonding layer on a front side of a second wafer to the first bonding layer of the first wafer;
forming a third bonding layer on a backside of the second wafer; and
fusing a fourth bonding layer on a front side of a third wafer to the third bonding layer.

11. The method of claim 10, wherein the first bonding layer and the second bonding layer are each between 0.8 µm and 3 µm thick.

12. The method of claim 10, further comprising bonding the first via to a corresponding contact pad of the second wafer.

13. The method of claim 10, wherein the first wafer and second wafer together form a first two-wafer stack, further comprising:
bonding the first two-wafer stack to a second two-wafer stack to form a four-wafer stack.

14. The method of claim 10, further comprising:
fusing a fifth bonding layer on a front side of a fourth wafer to the third wafer to form a four-wafer stack.

15. The method of claim 10, wherein the first wafer, the second wafer, and the third wafer are part of a first wafer stack, further comprising:
bonding the first wafer stack to a device wafer; and
singulating a package device from the device wafer and first wafer stack.

16. A method comprising:
bonding a first wafer to a second wafer, comprising at a bonding interface of the first wafer and the second wafer, physically coupling metal vias of the first wafer to bond pads of the second wafer and physically fusing a first bonding layer of the first wafer to a second bonding layer of the second wafer, the first bonding layer disposed at a back side of the first wafer, the second bonding layer disposed at a front side of the second wafer, the metal vias of the first wafer traversing through the first bonding layer, through a semiconductor substrate, and through a first interconnect of the first wafer;
bonding a third wafer to the second wafer, comprising physically fusing a fourth bonding layer of the third wafer to a third bonding layer of the second wafer; and
bonding a fourth wafer to the third wafer, comprising physically fusing a sixth bonding layer of the fourth wafer to a fifth bonding layer of the third wafer.

17. The method of claim 16, wherein each of the first wafer, second wafer, third wafer, and fourth wafer are face down.

18. The method of claim 16, further comprising:
etching recesses in a front side of the first wafer;
forming the metal vias in the first wafer;
thinning the back side of the first wafer to expose the metal vias;
recessing the back side of the first wafer to cause the metal vias to protrude from the back side of the first wafer; and
depositing the first bonding layer to laterally surround the metal vias.

19. The method of claim 16, further comprising:
bonding a front side of the first wafer to a device wafer to form a multi-wafer stack;
attaching the multi-wafer stack to a carrier;
forming connectors on the device wafer; and
singulating a package from the multi-wafer stack.

20. The method of claim 16, further comprising:
forming the first bonding layer over the back side of the first wafer;
forming openings in the first bonding layer to expose through-silicon vias of the first wafer; and
forming the metal vias in the openings to extend the through-silicon vias through the first bonding layer.

* * * * *